United States Patent
Yang et al.

(10) Patent No.: US 7,406,104 B2
(45) Date of Patent: Jul. 29, 2008

(54) TERRESTRIAL DIGITAL MULTIMEDIA/TELEVISION BROADCASTING SYSTEM

(76) Inventors: Lin Yang, 875 Yakima Dr., Fremont, CA (US) 94539; Zhi-Xing Yang, Electrical Engieering Department, Tsinghua University, Beijjiing (CN)

( * ) Notice: Subject to any disclaimer, the term of this patent is extended or adjusted under 35 U.S.C. 154(b) by 1021 days.

(21) Appl. No.: 10/312,486

(22) PCT Filed: Aug. 23, 2001

(86) PCT No.: PCT/US01/26565

§ 371 (c)(1),
(2), (4) Date: Jun. 27, 2003

(87) PCT Pub. No.: WO02/17615

PCT Pub. Date: Feb. 28, 2002

(65) Prior Publication Data

US 2004/0101046 A1 May 27, 2004

(30) Foreign Application Priority Data

Aug. 25, 2000 (CN) ................................. 00 1 23597

(51) Int. Cl.
*H04J 3/06* (2006.01)
(52) U.S. Cl. .................... 370/509; 370/204; 370/342
(58) Field of Classification Search ................ 370/204, 370/206, 207, 208, 320, 342, 335, 337, 509
See application file for complete search history.

(56) References Cited

U.S. PATENT DOCUMENTS 5,703,880 A * 12/1997 Miura ....................... 370/465
6,172,993 B1 * 1/2001 Kim et al. ................... 370/516
6,185,255 B1 * 2/2001 Twitchell et al. ........ 375/240.25
6,191,903 B1 * 2/2001 Fujimoto et al. ............. 360/48
6,266,349 B1 * 7/2001 Fukui et al. ................. 370/515
6,272,194 B1 * 8/2001 Sakamoto ................... 375/368
6,396,826 B1 * 5/2002 Ohlson et al. ............... 370/342
6,466,564 B1 * 10/2002 Rakib et al. ................. 370/342
6,625,239 B1 * 9/2003 Shiraishi et al. ............. 375/354
6,778,556 B1 * 8/2004 Chin et al. .................. 370/468
6,947,476 B2 * 9/2005 Song ........................... 375/149
7,012,906 B1 * 3/2006 Song ........................... 370/335
2002/0034225 A1 * 3/2002 Martini et al. .......... 375/240.01

* cited by examiner

*Primary Examiner*—Firmin Backer
*Assistant Examiner*—Nguyen Ngo
(74) *Attorney, Agent, or Firm*—Patent Law Group LLP; Carmen C. Cook

(57) ABSTRACT

A system for transmitting information as frames in digital format between users on a network using a single frequency and TDMA and/or CDMA communications. Broadcasting, multicasting and unicasting are provided, and communications may be part of a downlink and/or an uplink signaling scheme that allows user-user and user-central station communication. A synchronization segment or pre-amble for a frame may include identification of the source and/or the intended recipient. Walsh, Haar, Rademacher coding of selected frame components, among others, can be incorporated. Reed Solomon encoding, signal interleaving and intra-leaving, trellis encoding and turbo encoding are used for error detection and correction. The system provides two-way communication with the Internet and/or with a cellular network and/or for smaller networks of users.

37 Claims, 15 Drawing Sheets

| Index | Walsh Code Sequence |
|---|---|
| 0  | 0000000000000000 |
| 15 | 0101010101010101 |
| 7  | 0011001100110011 |
| 8  | 0110011001100110 |
| 3  | 0000111100001111 |
| 12 | 0101101001011010 |
| 4  | 0011110000111100 |
| 11 | 0110100101101001 |
| 1  | 0000000011111111 |
| 14 | 0101010110101010 |
| 6  | 0011001111001100 |
| 9  | 0110011010011001 |
| 2  | 0000111111110000 |
| 13 | 0101101010100101 |
| 5  | 0011110011000011 |
| 10 | 0110100110010110 |
Fig. 7
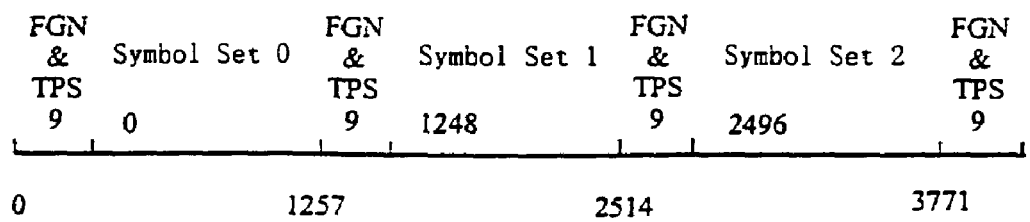
Fig. 8
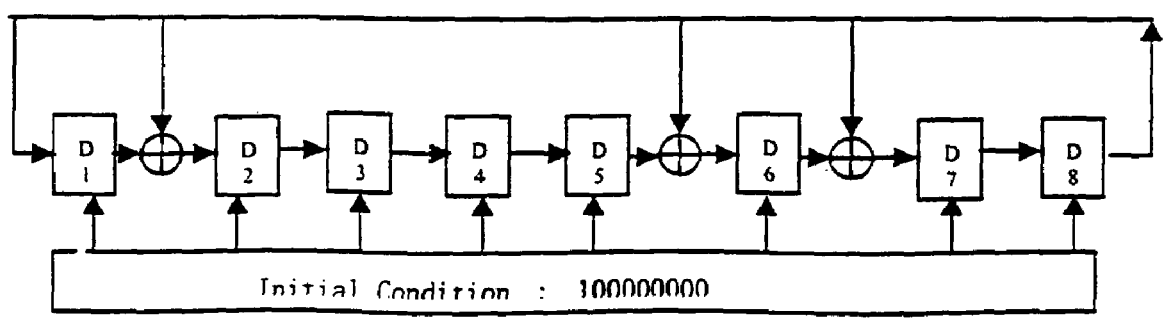
Fig. 9

TERRESTRIAL DIGITAL MULTIMEDIA/TELEVISION BROADCASTING SYSTEM

FIELD OF THE INVENTION

This invention relates to digital television broadcasting technology, and more particularly to terrestrial digital multimedia/television broadcasting systems. This invention can be used for terrestrial, satellite, cable, microwave and other transmission media, for data broadcasting, Internet and other wideband multimedia information transmission, and for integrated data service applications.

BACKGROUND OF THE INVENTION

After a decade of intense research and development, Digital Television Terrestrial Broadcasting (DTTB) has finally reached the implementation stage. DTTB services have been available in North America and Europe since November 1998. Many countries have announce their choice for a DTTB system and their implementation plan. Currently, there are three DTTB transmission standards in the world.

1) The Trellis-Coded 8-Level Vestigial Side-Band (8-VSB) modulation system developed by the Advanced Television Systems Committee (ATSC).

The ATSC was developed by the Advanced Television Systems Committee.

Grand Alliance (GA) was founded by some HDTV groups in May 1993. After the GA system was tested by Advance TV Test Center (ATTC), ATSC submitted the DTV standards to FCC in September 1995. FCC published the ATSC DTV standards on Dec. 26, 1996. The ATSC system was designed to transmit high-quality video and audio (HDTV) and ancillary data over a single 6 MHz channel. The system was developed for terrestrial broadcasting and for cable distribution. It can reliably deliver 19.4 Mbit/sec of data throughput in a 6 MHz terrestrial channel, and 38.8 Mbit/sec in a cable television channel. Its compression rate is 50:1 or higher. The ATSC system is made up of three subsystems: source code and compression subsystem, service multiplex and transport subsystem, and RF transmission subsystem.

2) The Coded Orthogonal Frequency Division Multiplexing (COFDM) modulation adopted in the Digital Video Terrestrial Broadcasting—Terrestrial (DVB-T) standard.

The DVB-T system was developed by a European consortium of public and private sector organizations, the Digital Video Broadcasting Project.

This European consortium stopped the research of analog HD-MAC system in 1993, and began to develop digital radio broadcasting. Subsequently, European ETSI published DVB-S, DVB-C and DVB-T, etc., so the DVB-T specification is part of a family of specifications also covering satellite (DVB-S) and cable (DVB-C) operations. This family allows for digital video and digital audio transport, as well as forthcoming multimedia services. The net bit rate available in an 8 MHz channel ranges between 4.98 Mbits/sec and 31.67 Mbit/sec, depending on the choice of channel coding parameters, modulation types, and guard interval duration.

For source code, DVB standards adopted an MPEG2-2 compression method and an MPEG2-1 transport stream and multiplex method. For terrestrial transmission, DVB-T specifies COFDM modulation, which is very different from ATSC 8-VSB modulation. Thus, compared with ATSC system, DVB-T can withstand high-level (up to 0 dB), long delay static and dynamic multipath distortion. The system is robust to interference from delayed signals, either echoes resulting from terrain or building reflections, or signals from distant transmitters in a single frequency network environment.

3) The Bandwidth Segmented Transmission (BST)-OFDM system for Terrestrial Integrated Service Digital Broadcasting (ISDB-T).

The ISDB-T system was developed by the Association of Radio Industries and Businesses (ARIB) in Japan. The ISDB system was developed for terrestrial (ISDB-T) and satellite (ISDB-S) broadcasting. It systematically integrates various kinds of digital contents, each of which may include multi-program video from SDTB to HDTV, Multiprogram-audio, etc. The system uses a modulation method referred to as Band Segmented Transmission (BST) OFDM, which consists of a set of common basic frequency blocks called BST-Segments. Each segment has a bandwidth of BW/14 MHz, where BW corresponds to the terrestrial television channel spacing (6, 7, or 8 MHz, depending on the region). In addition to the properties of OFDM, the BST-OFDM provides hierarchical transmission features by using different carrier modulation schemes and coding rates of the inner code on different BST-segments.

Because there are more than one DTTB system, many countries and administrations are now engaged in the process of selecting a DTTB system. Each country has specific characteristics and needs. The selection of a DTTB system must be based upon how well each modulation system meets specific conditions such as spectrum resource, policy, coverage requirements, transmission network structure, reception conditions, type of service required, objectives for program exchange, cost to the consumers and broadcasters, etc.

Based on problem analysis of these three terrestrial digital TV broadcasting systems, we have invented an original terrestrial digital TV system which meets DTV needs.

SUMMARY OF THE INVENTION

The aim of this invention is to provide a method of digital information transmission. The system can operate within the existing analog television spectrum or channel, where each 8 MHz channel payload data rate is 33 Mbit per second. The key technology is the time domain synchronous OFDM (TDS-OFDM) modulation with mQAM/QPSK; its spectrum efficiency is 4 bits/Hz. The system uses forward error correction (FEC) to withstand burst errors, such as Reed-Solomon (RS) code, Turbo code, convolutional code. TCM, TCM-Turbo, inner interleaving and outer interleaving, etc. The system provides hierarchical modulation and code for hierarchical services, as well as multimedia service.

Another aim of this invention is to provide terrestrial digital multimedia/television broadcasting system which adopts mentioned method of digital information transmission.

According to the first aim of this invention, this invention provides a method for transmission of information in digital form, the method comprising: transmitting at least first and second frames, each frame having a selected number F of binary digits or bits, and each frame having a signal synchronization segment of a first selected length and a signal body segment of a second selected length, where the synchronization segment for the first frame has a selected bit pattern that distinguishes this segment from a selected bit pattern segment of the second frame, and where the synchronization segment for at least one of the first frame and the second frame can be used to temporally synchronize at least one frame.

The said method, further comprising including in said selected bit pattern for said signal synchronization segment, an indicium that identifies an intended signal recipient for the at least two frames.

The said method, further comprising including in said selected bit pattern for said signal synchronization segment an indicium that identifies a source of said at least two frames.

The said method, further comprising using said synchronization segment selected bit patterns to distinguish at least $2^N-1$ frames from each other, where said synchronization segment of each of said frames has a length of at least N bits, and N is a selected positive integer.

The said method, further comprising choosing said integer N to be 9.

The said method, further comprising choosing synchronization segment selected bit patterns to include a pseudonoise sequence that is generated by an Nth degree polynomial $p(x)=0$, where x is a Boolean variable.

The said method, further comprising choosing synchronization segment selected bit patterns to include a pattern generated by forming an Exclusive OR of a first sequence of binary valued numbers that is a pseudonoise sequence that is generated by an Nth degree polynomial $p(x)=0$, where x is a Boolean variable, and a second sequence of binary-valued numbers that is selected orthogonal sequence having a selected code length.

The said method, further comprising choosing said selected orthogonal sequence from the group of orthogonal sequences consisting of a Walsh code sequence, a Haar code sequence and a Rademacher code sequence.

The said method, further comprising including in said signal synchronization segments for each of said first frame and said second frame a sub-segment of selected bit length F ($\leq$F) that is configured so that said first frame sub-segment is orthogonal to said second frame sub-segment.

The said method, further comprising choosing said body segment of at least one of said frames to have lengths consisting of the positive integers 208, 104 and 52.

The said method, further comprising providing error detection and correction for said digital information by using Reed Solomon encoding, designated RS(m,n), where (m,n) are a pair of integers drawn from the group of pairs consisting of (m,n)=(208,188), (208,200). (104,84), (104,96), (52,32) and (52,44).

The said method, further comprising providing said detection and correction for said digital information by using error encoding drawn from the group consisting of trellis 64QAM, trellis 16QAM, trellis QPSK, Turbo trellis 64QAM, and Turbo QPSK.

The said method, further comprising transmitting said information as high definition television signals.

The said method, further comprising transmitting said information as a cellular telephone signal having at least one intended signal recipient.

The said method, further comprising transmitting said information as a paging signal having at least one intended signal recipient.

The said method, further comprising transmitting said information in at least two frames from a network control center, having associated data broadcasting database and being connected to the Internet, as a downlink signal to at least one base station that is spaced apart from the network control center.

The said method, further comprising transmitting said information(?) at least two frames from said base station to said network control center as an uplink signal.

The said method, further comprising transmitting said information at least two frames from said base station to a signal-receiving terminal that is spaced apart from at least one of said network control centers and said base station, as a downlink signal.

The said method, further comprising transmitting said information at least two frames from said terminal to said base station as an uplink signal.

The said method, further comprising choosing said signal synchronization segment length to be 721 symbols.

The said method, further comprising choosing said signal body segment length to be 4656 symbols.

The said method, further comprising choosing said signal body segment to include a guard interval sequence having 912 consecutive symbols.

The said method, further comprising collecting a selected number F1 of said frames into a Frame Group, where F1 is a selected integer at least equal to 2, and providing a selected Frame Group Header for the Frame Group.

The said method, further comprising choosing said number F1 to be 511.

The said method, further comprising including in said Frame Group Header a guard interval having 936 consecutive symbols.

The said method, further comprising collecting a selected number F2 of said Frame Groups into a Super Frame, where F2 is a selected integer at least equal to 2, and providing a selected Super Frame Header for the Super Frame.

The said method, further comprising choosing said number F2 to be 511.

The said method, further comprising collecting a selected number F3 of said Super Frames into a Super Frame Group, where F3 is a selected integer at least equal to 2, and providing a selected Super Frame Header for the Super Frame Group.

The said method, further comprising choosing said number F3 to be about 479.

The said method, further comprising transmitting said Super Frame Group at least twice in a selected time interval having a selected time interval length 2T(SFG).

According to the second aim of this invention, this invention provides a terrestrial digital multimedia/television broadcasting system which used mentioned method, the system comprising: a network control center having a transmitter that transmits at least first and second frames, each frame having a selected number F of binary digits or bits, and each frame having a signal synchronization segment of a first selected length and a signal body segment of a second selected length, where the synchronization segment for the first frame has a selected bit pattern that distinguishes this segment from a selected bit pattern segment of the second frame, and where the synchronization segment for at least one of the first frame and the second frame can be used to temporally synchronize at least one frame.

The said system, further comprising including in said selected bit pattern for said signal synchronization segment an indicium that identifies an intended signal recipient for at least one of two frames.

The said system, further comprising including in said selected bit pattern for said signal synchronization segment an indicium that identifies a source of at least one of two frames.

The said system, further comprising using said synchronization segment selected bit patterns to distinguish at least two frames from each other, where said synchronization segment of each of said frames has a length of at least N bits, and N is a selected positive integer.

The said system, further comprising choosing said integer N to be 9.

The said system, further comprising choosing synchronization segment selected bit patterns to include a pseudonoise sequence that is generated by an Nth degree polynomial $p(x)=0$, where x is a Boolean variable.

The said system, further comprising choosing synchronization segment selected bit patterns to include a pattern generated by forming an Exclusive OR of a first sequence of binary valued numbers that is a pseudonoise sequence that is generated by an Nth degree polynomial p(x)=0, where x is a Boolean variable, and a second sequence of binary-valued numbers that is selected orthogonal sequence having a selected code length.

The said system, further comprising choosing said selected orthogonal sequence from the group of orthogonal sequences consisting of a Walsh code sequence, a Haar code sequence and a Rademacher code sequence.

The said system, further comprising including in said signal synchronization segments for each of said first frame and said second frame a sub-segment of selected bit length F that is configured so that said first frame sub-segment is orthogonal to said second frame sub-segment.

The said system, further comprising choosing said body segment of at least one of said frames to have a length consisting of the positive integers 208, 104 and 52.

The said system, further comprising providing error detection and correction for said digital information by using Reed Solomon encoding, designated RS(m,n), where (m,n) are a pair of integers drawn from the group of pairs consisting of (m,n)=(208,188), (208-200), (104,84), (104,96), (52,32), and (52,44).

The said system, further comprising providing said detection and correction for said digital information by using error encoding drawn from the group consisting of trellis 64QAM, trellis 16QAM, trellis QPSK, Turbo trellis 64QAM, and Turbo QPSK.

The said system, further comprising transmitting said information as high definition television signals.

The said system, further comprising transmitting said information as a cellular telephone signal having at least one intended signal recipient.

The said system, further comprising transmitting said information as a paging signal having at least one intended signal recipient.

The said system, further comprising transmitting at least two frames from a network control center, having associated data broadcasting database and being connected to the Internet, as a downlink signal to at least one base station that is spaced apart from the network control center.

The said system, further comprising transmitting at least two frames from said base station to said network control center as an uplink signal.

The said system, further comprising transmitting at least two frames from said base station to a signal-receiving terminal that is spaced apart from at least one of said network control centers and said base station, as a downlink signal.

The said system, further comprising transmitting at least two frames from said terminal to said base station as an uplink signal.

The said system, further comprising choosing said signal synchronization segment length to be 721 symbols.

The said system, further comprising choosing said signal body segment length to be 4656 symbols.

The said system, further comprising choosing said signal body segment to include a Guard interval sequence having 912 consecutive symbols.

The said system, further comprising collecting a selected number F1 of said frames into a Frame Group, where F1 is a selected integer at least equal to 2, and providing a selected Frame Group Header for the Frame Group.

The said system, further comprising choosing said number F1 to be 511.

The said system, further comprising including in said Frame Group Header a guard interval having 936 consecutive symbols.

The said system, further comprising collecting a selected number F2 of said Frame Groups into a Super Frame, where F2 is a selected integer at least equal to 2, and providing a selected Super Frame Header for the Super Frame.

The said system, further comprising choosing said number F2 to be 511.

The said system, further comprising collecting a selected number F3 of said Super Frames into a Super Frame Group, where F3 is a selected integer at least equal to 2, and providing a selected Super Frame Header for the Super Frame Group.

The said system, further comprising choosing said number F3 to be about 479. The said system, further comprising transmitting said Super Frame Group at least twice in a selected time interval having a selected time interval length 2T(SFG).

BRIEF DESCRIPTION OF THE DRAWINGS

FIG. 7 illustrates a 16th order Walsh code and its corresponding index.

FIG. 8 illustrates data multiplexing in a DFT block in the invention.

FIG. 9 shows a Fibonacci type linear feedback shift register (LFSR) which is configured as $x^8+x^6+x^5+x+1$

DESCRIPTION OF BEST MODES OF THE INVENTION

Figure 1:
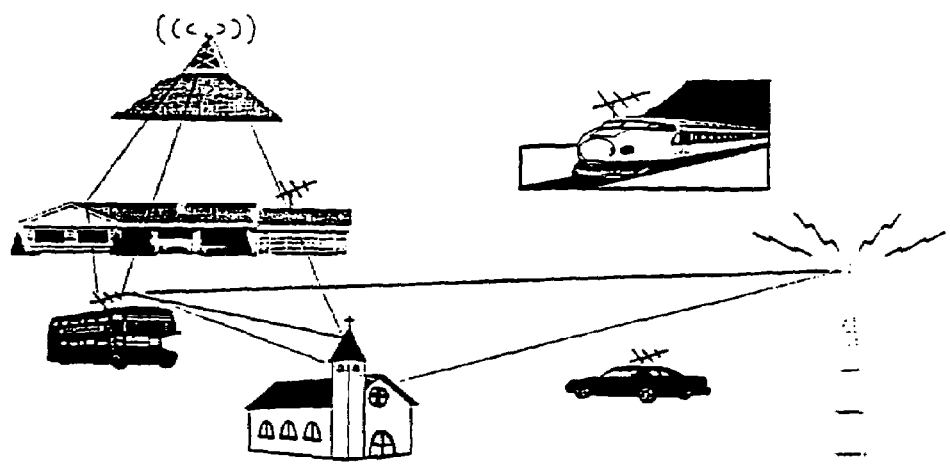
FIG. 1 illustrates an environment for use of the invention.

An aim of this invention is terrestrial digital TV broadcasting system in an environment shown in FIG. 1. Multimedia information, such as Television programs, data, graph, audio, etc., encoded by source code, transmission code and channel code, are transmitted to cover an area by one or more transmitters. These transmitters can flexibly form a multi frequency network (MFN) or a single frequency network (SFN).

Figure 2:
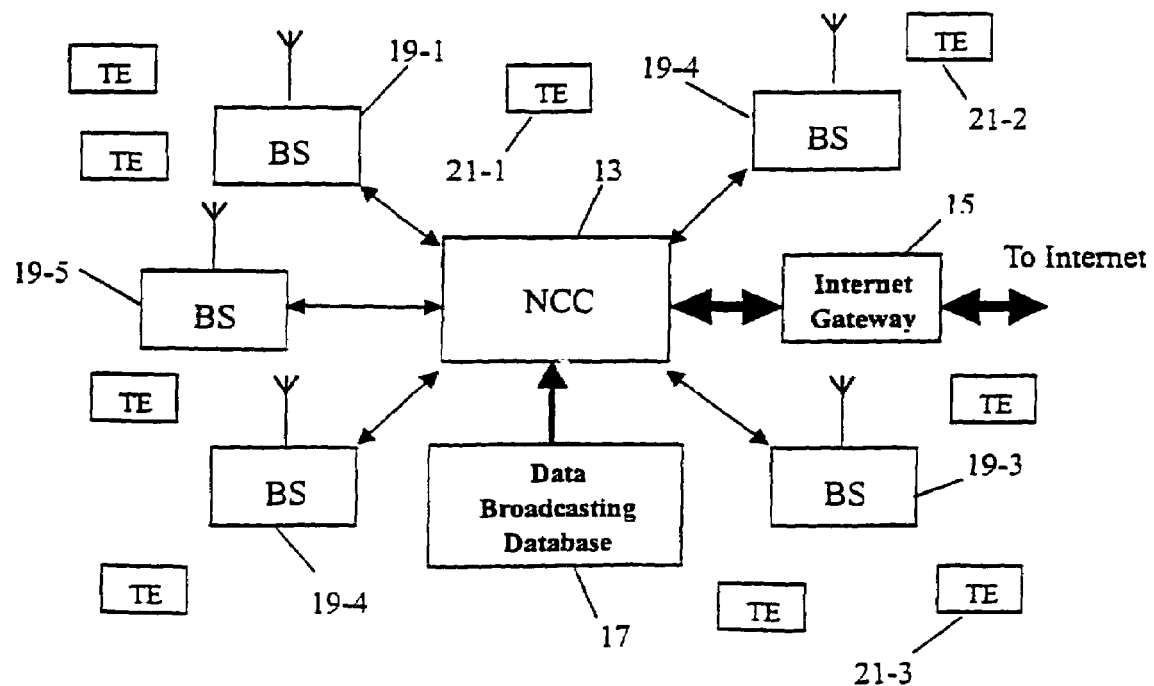
FIG. 2 illustrates structure of an embodiment of the invention.

FIG. 2 shows the block diagram of terrestrial digital multimedia/television broadcasting system in this invention.

As shown in FIGS. 1 and 2, more than one transmitter which locates different place (they may be local TV stations, or local transmission base stations) can form complete terrestrial digital TV broadcasting network. FIG. 1 shows two transmission stations, which receive one or more multimedia TV programs from a TV station or network control center (1) and forward them. In coverage area, a user can be a receiver with outdoor fixed antenna, a receiver with set-top antenna, or a portable receiver, where coverage depends on many factors, such as terrain (mountains, valleys, horizon or man-made structures), transmitting tower height and power, receiving antenna height and gain/directivity, etc.; thus received signal not only has direct path signals, but also has delayed signals, either echoes resulting from terrain or building reflections, or signals from distant transmitters in a single frequency network environment; hence there is a multipath interference occurs. Because this system adopts OFDM technology, multipath interference is overcome. DMB-T technology can withstand static and dynamic multipath distortion. For low or high speed mobile reception with a vehicle antenna, Doppler effects will be present. Hence, for stably and reliably receiving information, this invention also supports mobile receiving.

Figure 3:
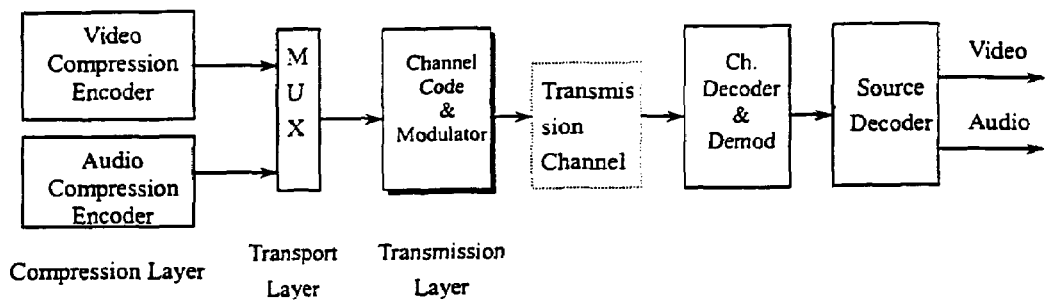
FIG. 3 illustrates system components of an embodiment of the invention.

FIG. 3 shows the signal structure of terrestrial digital broadcasting system in this invention. It is made up of three layers: compression layer, transport layer and transmission layer. The transmission channel (or named transmission media) decides how to construct a transmission layer, media has cable media (optical fiber, coaxial and HFC), radio media (satellite, microwave and MMDS, etc.) and terrestrial wave radio media. Compress layer and transport layer are almost the same for each transmission media, but transmission layer is different. So this invention faces the transmission layer of terrestrial radio media.

By the way, digital TV is also divided into source CODEC, stream multiplex, FEC CODEC and channel modulation. Source CODEC belongs to mentioned compression layer, including audio and video compression, mainly standards have ISO/IEC MPEG1, MPEG2, MPEG4, etc. Of course, other new methods may be adopted, such as wavelet transform and fractal theory. Stream multiplex belongs to transport layer, mainly specification is MPEG2-system part. FEC and modulation belong to transmission layer which differ from each other because of different transmission media.

A key component of this invention is the transmission layer. Because different transmission media have different transmission performance, thus different transmission layer is adopted, but generally DTV system contains two parts: FEC part and modulation part.

Terrestrial DTV FEC can use outer code FEC (Reed-Solomon code), outer interleaving, inner code FEC, inner interleaving, block diagrams of American ATSC, European DVB-T and Japanese ISDB-T in a similar manner, but this invention improves the concrete implementation and performance and results in better performance on signal peak to average power ratio, C/N threshold, spectrum efficiency, impulse noise, phase noise and continuous wave (CW) interference.

Present modulation schemes have single carrier and multi-carrier schemes. ATSC 8VSB is a single carrier scheme, but European DVB-T COFDM, Japanese ISDB-T BST OFDM and DMB-T TDS-OFDM have all adopted multi-carrier modulation schemes.

Detailed technology involved in this invention is first introduced as follows:

1. Channel Data Pack Structure

A physical channel has the following features in this invention:

Hierarchical frame structure

Orthogonal frequency multi-carrier modulation (also called OFDM or DMT)

PN sequence pilot synchronization

Periodic transmission scheme with cycle time as natural day

Unique frame address to support time-sharing multiple access

Hybrid continuous and burst data transmission 1.1 Frame Structure Description

Figure 5:
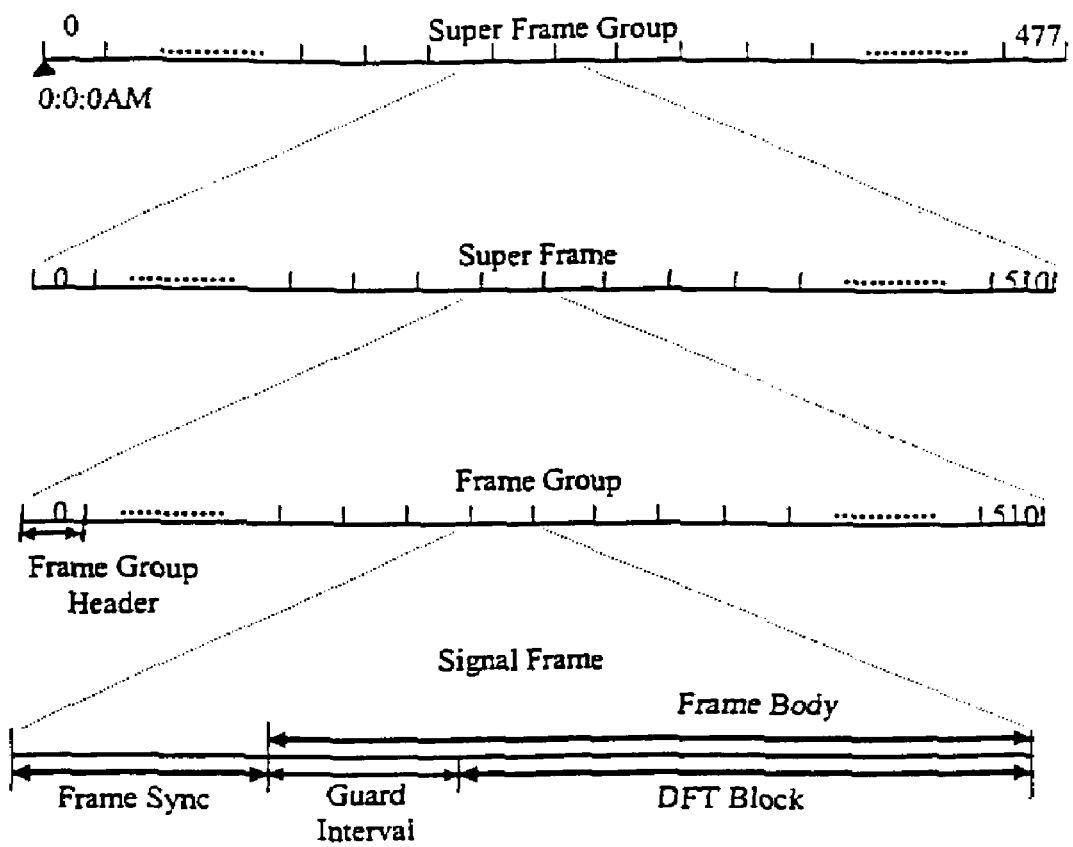
FIG. 5 illustrates a data pack frame structure of the invention.

The physical channel frame structure in this invention is shown in FIG. 5. The frame structure is hierarchical. A basic frame is called a Signal Frame. The Signal Frame consists of two parts, namely: the Frame Sync and the Frame Body. The Frame Group is defined as a croup of Signal Frames with the first frame specially defined as Frame Group Header. The Super Frame is defined as a group of Frame Groups. The top of the frame structure is called a Super Frame Group, as shown in the figure. For example, one Super Frame Group consists of 478 Super Frames, one Super Frame consists of 512 Frame Groups, and one Frame Group consists of 255 Signal Frames. The physical channel is periodic and synchronized with the absolute time.

The Signal Frame is the basic element of the downlink physical channel. A Signal Frame consists of two parts, the Frame Sync and the Frame Body. The baseband symbol rates for both Frame Sync and Frame Body are the same, and are defined as 7.56 MSPS. A Frame Sync uses BPSK modulation scheme for robust synchronization. The Frame Sync consists of pre-amble, PN sequence, and post-amble. The number of symbols in Frame Sync depends on the number of symbols in the pre-amble and post-amble, as described in Table I.

TABLE 1

Number of Symbols in Frame Sync

| Symbols In Frame Sync | Symbols In Preamble | Symbols In PN Sequence | Symbols In Post-amble |
|---|---|---|---|
| 256 | 0 | 255 | 1 |
| 304 | 24 | 255 | 25 |
| 384 | 25 | 255 | 104 |

OFDM modulation scheme is used for the Frame Body. The DFT block has 3780 symbols and last 500 us. The guard interval can be chosen as 1/6, 1/9, 1/12, 1/20 or 1/30 of the DFT block, as shown in Table 2. The number of symbols in an OFDM block also is shown in Table 2.

TABLE 2

Number of Symbols in OFDM Block

| Symbols In OFDM Block | DFT Block (As Fraction of Guard Interval) | Symbols In Guard Interval |
|---|---|---|
| 4410 | 1/6 | 630 |
| 4200 | 1/9 | 420 |
| 4095 | 1/12 | 315 |
| 3969 | 1/20 | 189 |
| 3906 | 1/30 | 126 |

Depending on the selected Frame Sync and OFDM guard interval, a Signal Frame will have different numbers of symbols as shown in Table 3. The corresponding time for a Signal Frame is also shown in Table 3.

TABLE 3

Number of Symbols in a Signal Frame

| Time (μsec) Of Frame Sync | Symbols In Signal Frame | Symbols In Frame Sync | Symbols In OFDM Block |
|---|---|---|---|
| 617.2 | 4666 | 256 | 4410 |
| 623.5 | 4714 | 304 | 4410 |
| 634.1 | 4794 | 384 | 4410 |
| 589.4 | 4456 | 256 | 4200 |
| 595.8 | 4504 | 304 | 4200 |
| 606.3 | 4584 | 384 | 4200 |
| 575.5 | 4351 | 256 | 4095 |
| 581.9 | 4399 | 304 | 4095 |
| 592.5 | 4479 | 384 | 4095 |
| 558.9 | 4225 | 256 | 3969 |
| 562.5 | 4273 | 304 | 3969 |
| 575.8 | 4353 | 384 | 3969 |
| 550.5 | 4162 | 256 | 3906 |
| 556.9 | 4210 | 304 | 3906 |
| 567.5 | 4290 | 384 | 3906 |

A Frame Group consists of 255 Signal Frames with the first one defined as Frame Group Header. The Signal Frames in a Frame Group have unique Frame Numbers (FN), from 0 to 254, which is encoded in the Frame Sync of the Signal Frame. A Frame Group lasts about between 140.4 msec to 161.7 msec depending on the number of samples in its Signal Frame.

Each Frame Group is uniquely identified by its Frame Group Number, which is coded in every Signal Frame. As indicated in FIG. 5, the first Frame Group of a Super Frame is numbered as 0 and the last is numbered as 511.

A Super Frame Group is periodically repeated with a natural day as the period which is coded in the first two bytes of the first Frame Group Header in the Super Frame. Code format is decimal MM/DD/YY as shown in Table 4. At the time 0:0:0 am PST or other reference time, the physical channel frame structure will be reset and a new Super Frame Group will be started. There are between 1044 and 1130 Super Frames in each Super Frame Group. The last Super Frame of each Super Frame Group may not be completed at the reset time.

As described above, the lower layers of the hierarchical synchronization channel structure are embedded in a downlink Signal Frame. The higher layers, SFGN and SFN, of the hierarchical synchronization channel structure are coded in the first Frame Group Header of a Super Frame.

The SFGN and SFN data packets are defined as Super Frame Synchronization Packet, and shown in Table 4.

TABLE 4

The Downlink Super Frame Synchronization Packet

| D3 | D2 | D1 | D0 | M3 | M2 | M1 | M0 |
|---|---|---|---|---|---|---|---|
| Y6 | Y5 | Y4 | Y3 | Y2 | Y1 | Y0- | D4 |
| SFGN7 | SFGN6 | SFGN5 | SFGN4 | SFGN3 | SFGN2 | SFGN1 | SFGN0 |
| SFN7 | SFN6 | SFN5 | SFN4 | SFN3 | SFN2 | SFN1 | SFN0 |
| SFGN8 | SFN8 | BS5 | BS4 | BS3 | BS2 | BS1 | BS0 |

M3, M2, M1, M0=Month of a date, ranging from 1 to 12
D4, D3, D2, D1, D0=Day of a date, ranging from 1 to 31
Y6-Y0=Year of a date, ranging from 0 to 99
SFGB8-SFGN0=Super Frame Group Number
SFN8-SFN0=Super Frame Number
BS5-BS0=Base Station flags; default is 0

1.2 Signal Frame Structure 1.2.1 Frame Sync PN Sequence

The baseband Frame Sync signal consists of a pre-amble, a PN sequence and a post-amble. The pre-amble can be defined as 0, 24 or 25 symbols. The post-amble can be defined as 1, 15 or 104 symbols. The PN sequence has 255 symbols. The Frame Sync signals are different for different Signal Frames of a Signal Frame Group. Therefore, the Frame Sync can be used as the synchronization signature of a particular Signal Frame for identification purposes. The pre-amble and post-amble are defined as cyclical extensions of the PN sequences.

Figure 6:
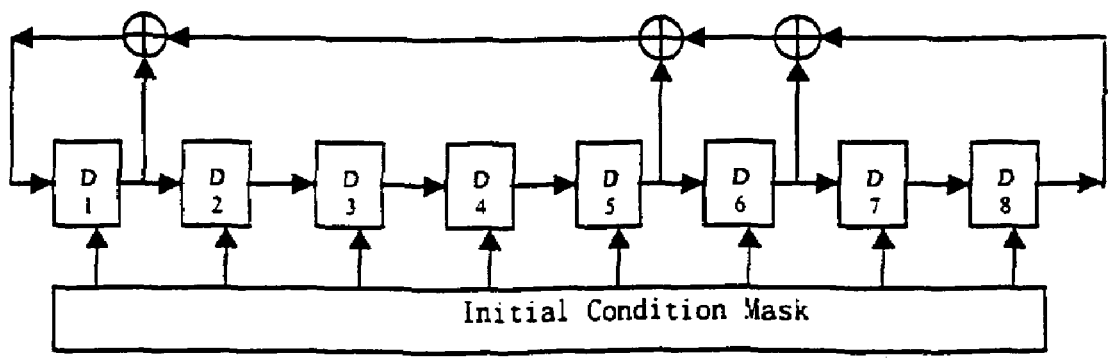
FIG. 6 shows a Fibonacci type linear feedback shift register (LFSR) which is configured as $x^8+x^6+x^5+x+1$ for particular feedback sequence used in the invention.

A PN sequences is defined as an 8th order m-sequence and is implemented by a Fibonacci Type linear feedback shift register (LFSR). Its characteristic polynomial is defined as: $P(x)=x^8+x^6+x^5+x+1$. The LFSR block diagram is shown in FIG. 6. The initial condition mask block will determine the phase of the generated m-sequence.

The PN sequences will map to a non-return to zero (NRZ) binary signal with the mapping defined as from 0 to +1 and from 1 to −1 values.

An Nth order Walsh code can be generated using Hadamard Matrix. An Nth order Hadamard Matrix is created recursively.

The 2nd order Hadamard Matrix, H(2), is defined as $$H_2 = \begin{vmatrix} 0 & 0 \\ 0 & 1 \end{vmatrix}.$$

The 4th order Hadamard Matrix, H4, is defined as $$H_4 = H_2 \otimes H_2 = \begin{vmatrix} 0 & 0 & 0 & 0 \\ 0 & 1 & 0 & 1 \\ 0 & 0 & 1 & 1 \\ 0 & 1 & 1 & 0 \end{vmatrix}$$

For N=2k, the Nth order Hadamard matrix is defined as $H_N = H_2 \otimes H_{N/2}$.

An Nth order Walsh code can be defined by the rows of the Nth order Hadamard Matrix. A Walsh code word is a row of the Hadamard Matrix. The index of a Walsh code word is defined as the number of switches from 0 to 1 and from 1 to 0 of the code word.

A 16th order Walsh code is shown in FIG. 7. The index of the Walsh code word is shown in the left column.

A Frame Sync sequence is encoded by a 16th order Walsh code word for multiple base station identification purpose. The Walsh code encoding procedure of the PN sequence for base station identification is as follows;

(1) Select a 26th order Walsh code word for the base station by the CDTVN network administrator.

(2) Expand the 16-bit Walsh code word into a 256/304/384-chip vector, according to the pre/post-amble of the PN sequence, by duplicating each of the 1's and 0's in the code word 16/19/24 times.

(3) XOR the to-be-encoded Frame Sync sequence with the chip vector from step (2), chip-by-chip, to create the Walsh code encoded Frame Sync sequence.

1.2.2 Frame Body

The baseband signal of a Frame Body is an Orthogonal Frequency Division Multiplexing (OFDM) block. An OFDM block can be further divided into a guard interval and a DFT block as shown in FIG. 8. In the time domain, different numbers of samples in each OFDM block correspond to the 3780 sub-carriers in the frequency domain of the OFDM block for different guard interval of the OFDM block. Refer to Table 2.

The DFT block in its time domain has 3780 samples of the inverse discrete Fourier transform (IDFT) of the 3780 sub-carriers in its frequency domain. The DFT block time domain signal lasts 500 μsec, which is equivalent to the 2 kHz intervals between two consecutive sub-carriers in its frequency domain.

There are five optional guard interval sizes of the DFT block size, namely: 1/6, 1/8, 1/12, 1/20 and 1/30. The signal of guard interval is the same as the last segment of the samples of the DFT block time domain signal. The guard interval time is between 16.7 μsec and 83.3 μsec for different guard interval sizes.

There are 3744 complex data symbols in an DFT block frequency domain for a Signal Frame. These 3744 data symbols are partitioned further into three Symbol Sets, each having 1248 complex symbols. The Symbol Sets are numbered as Symbol Set 0, Symbol Set 1 and Symbol Set 2.

The Frame Group Number has nine bits. The Frame Group Number is encoded as part of complex symbols in the IDFT block in the frequency domain. Each bit of the Frame Group Number will be mapped to the real part of a complex symbol, with 1 as the maximum positive value and 0 as the minimum value.

The imaginary part of the complex symbol for the Frame Group Number is reserved for a Transmission Parameter Signal CTPS), and is defined later.

The complex symbols in an IDFT block are multiplexed as shown in FIG. 8.

1.3 Synchronization Scheme

Downlink transmission protocol is used as a synchronous transmission scheme in this invention. The following lists some important features of this scheme:

A Super Frame Group is started at 0:0:0 am PST (Pacific Standard Time)

A Super Frame of a Super Frame Group is uniquely defined in its Frame Group Headers.

A Signal Frame Group of a Super Frame is uniquely defined in its Signal Frame.

A Signal Frame of a Frame Group can be uniquely identified by its Signal Frame Sync PN sequences.

A Synchronization signal is a power-boosted BPSK signal, which is much more powerful than the data signal modulated in an OFDM scheme.

The frame address scheme is based on a set of shifted m-sequences, each of which is a special type of pseudo-number (PN) sequence. An 8th order m-sequence is a periodic sequence with period 255. Based on the initial conditions of the LFSR in FIG. 6, 511 different phase m-sequences can be generated. The m-sequence will be numbered by its initial state of the LFSR in FIG. 4.

Using the characteristic polynomial of FIG. 5, the initial states will be numbered by the power of $x^{n(16)}$, with n=0, 1, 2, . . . .

For example, the initial state of the number zero m-sequence is 00000001, which is $x^{0(16)}=1$. The initial state of the number one m-sequence is 11110100, which is $x^{16}$. The initial state of the number two m-sequence is 11110100, which is $x^{2(16)}=x^{32}$. The initial state of the number 254 m-sequence is 00010110, which is $x^{239}$.

An arbitrary power of x can be converted to a state by using the characteristic polynomial. A Galois Type LFSR, as shown in FIG. 9, will generate the power of x in a continuous order.

Any Signal Frame of a Frame Group can be identified by its Frame Sync. There are 255 different m-sequences for the signal Frame Sync, which correspond to the 255 Signal Frames in a Frame Group of a Super Frame, numbered from 0 to 254. These can be identified from the Signal Frame DFT block.

Any Super Frame of a Super Frame Group is numbered starting from zero to the maximum number, and can be identified either from the PST time or from the data of the Frame Body.

The m-sequence of the Frame Sync will be used for Signal Frame Synchronization. The m-sequence of the Frame Sync in the Frame Group Header will be used for Signal Frame Group Synchronization. The Frame Group of a Super Frame can be identified by its Frame Group Header. The Frame Sync signal can be used for symbol timing recovery. The Frame Sync sequences are predictable after the initial acquisition procedure.

2. Forward Error Correction (FEC) Coding 2.1 Energy Disperse Code (Optionally Included)

Figure 10:
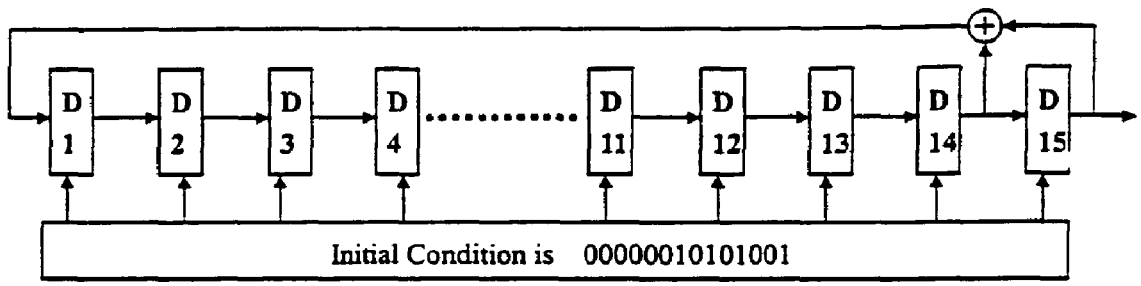
FIG. 10 shows an LFSR configured as $x^{15}+x^{14}+1$ for energy dispersion.

The energy disperse code is a PN sequence defined as $x^{15}+x^{14}+1$, with initial condition 100101010000000. The energy disperse code encoder is called a randomizer. The PN sequence can be generated by the LFRS as shown in FIG. 10.

The randomizer will be reset to the initial condition at the Signal Frame start, and will be free running until reset again. The least significant eight bits are XORed with the input byte steam.

2.2 Outer FEC Code

Outer code of the FEC will use Reed-Solomon codes.

2.2.1 High Protection Reed-Solomon Code, RS(208,188)

The high protection Reed-Solomon (RS) code is the shortened Reed-Solomon code of RS(255,235) with the same field generator polynomial and code generator polynomial, but different sizes.

The field generator polynomial is defined as:

$$p(x)=x^8+x^4+x^3+x^2+1,$$

and the code generator polynomial is defined as:

$$P(x;\alpha)=(x-1)(x-\alpha)(x-\alpha^2), \ldots (x-\alpha^{19}).$$

RS(208,188) code will be used for MPEG transport stream or other large size data packets. The RS(208,188) has 188 bytes as information data, and adds 20 bytes for error correction parity data. The RS(208,188) can correct up to 10 bytes of transmission errors.

The RS(208,188) code can be generated by the following procedure:

1) Prefix the 188 data bytes with 47 zero bytes as information bytes;
2) Encode the 235 information bytes into 255 code bytes; and
3) Remove the first 47 bytes of the code bytes.

Because the RS code is systematic code, the removed 47 bytes are zero bytes.

2.2.2 High Data Rate Reed-Solomon Code, RS(208,200)

The high data rate Reed-Solomon (RS) code is a shortened Reed-Solomon code RS(255,247) with the same field generator polynomial and code generator polynomial, but different sizes.

The field generator polynomial is defined as:

$$p(x)=x^8+x^4+x^3+x^2+1,$$

and the code generator polynomial is defined as:

$$P(x;\alpha)=(x-1)(x-\alpha)(x-\alpha^2),\ldots(x-\alpha^7)$$

RS(208,200) code has 200 bytes as information data, and adds 8 bytes error correction parity data. The RS(208,200) code can be generated by the following procedure:

1) Prefix the 200 data bytes by 55 zero bytes as information bytes;
2) Encode the 247 information bytes into 255 code bytes;
3) Remove the first 55 bytes of the code bytes.

2.3 Data interleave Scheme in Time

Transmission supports both continuous data stream and burst data stream applications in this invention. For continuous data stream, the data interleave scheme is called inter Signal Frame interleaving or time interleaving. For burst data stream, the data interleave scheme is intra-Signal Frame interleaving or frequency interleaving within a time slot.

Figure 11:
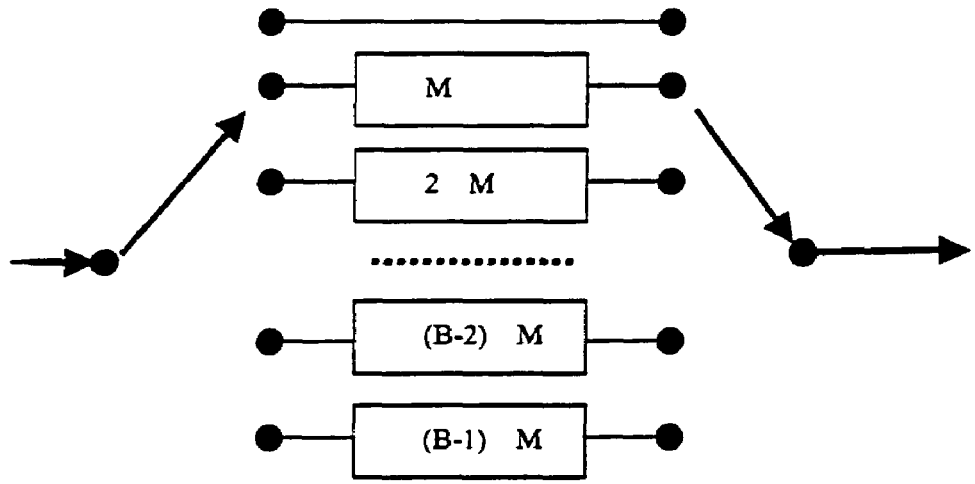
FIG. 11 illustrates a convolutional interleaving according to the invention.

The convolutional interleave scheme, shown in FIG. 11, is used for inter signal Frame data interleaving. The variable B refers to the interleave width (branches), and the variable M refers to the interleave depth (delay buffers). The total delay of the interleave/de-interleave pair can be calculated from M×(B−1)×B. Depending on the application, there are three interleave modes for inter Signal Frame data interleaving.

Mode 1: B=104, M=6 bytes. The total delay of the interleave/de-interleave is 64272 bytes, which corresponds to 309 RS (208,188) blocks. If nine RS(208,188) is transmitted in one Signal Frame for a data stream, then the interleave/de-interleave delay is 34 Signal Frames, which is about 22 msec.

Mode 2: B=52, M=4 bytes. The total delay of the interleave/de-interleave is 10608 bytes, which corresponds to 51 RS (208,188) blocks.

Mode 3: B=16, M=13 bytes. The total delay of the interleave/de-interleave is 3120 bytes, which corresponds to 15 RS(208,188) blocks.

2.4 Inner FEC Codes 2.4.1 Inner Codes for QPSK Symbol Constellations 2.4.1.1 Rate ½ Convolutional Code The rate ½ convolutional code will be used as the inner code of the concatenated codes for QPSK symbol constellations. The rate ½ convolutional code has 64 states. The generator polynomials of the rate ½ convolutional code are:

$$G1(x)=x^6+x^3+x^2+x+1.$$

$$G2(x)=x^6+x^5+x^3+x^2+1.$$

Figure 12:
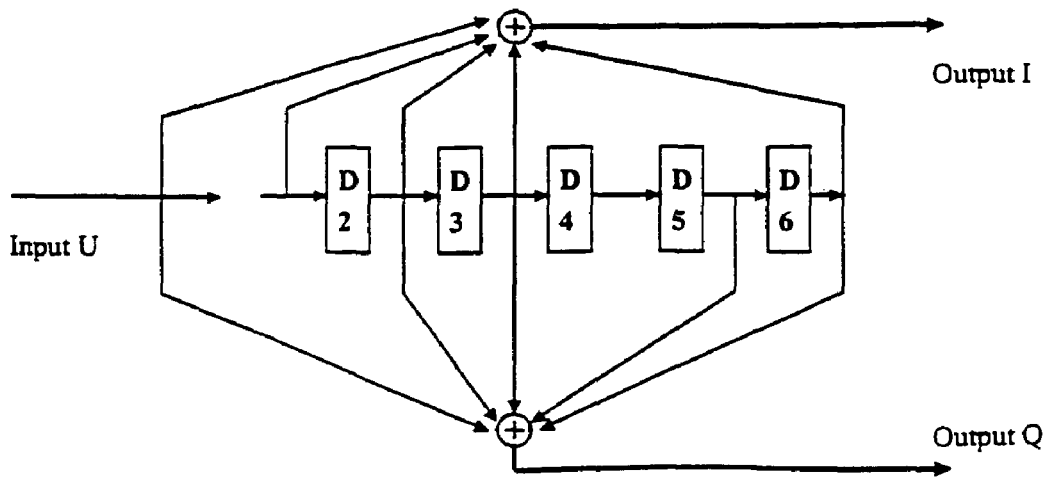
FIG. 12 illustrates a rate one-half convolutional code generator.

FIG. 12 shows the block diagram of the rate ½ convolutional code generator. An input bit U will generate two bits, I and Q, of a QPSK symbol.

2.4.1.2 ½ Parallel Concatenated Systemic Convolutional Turbo Code (Optionally Included)

Figure 13:
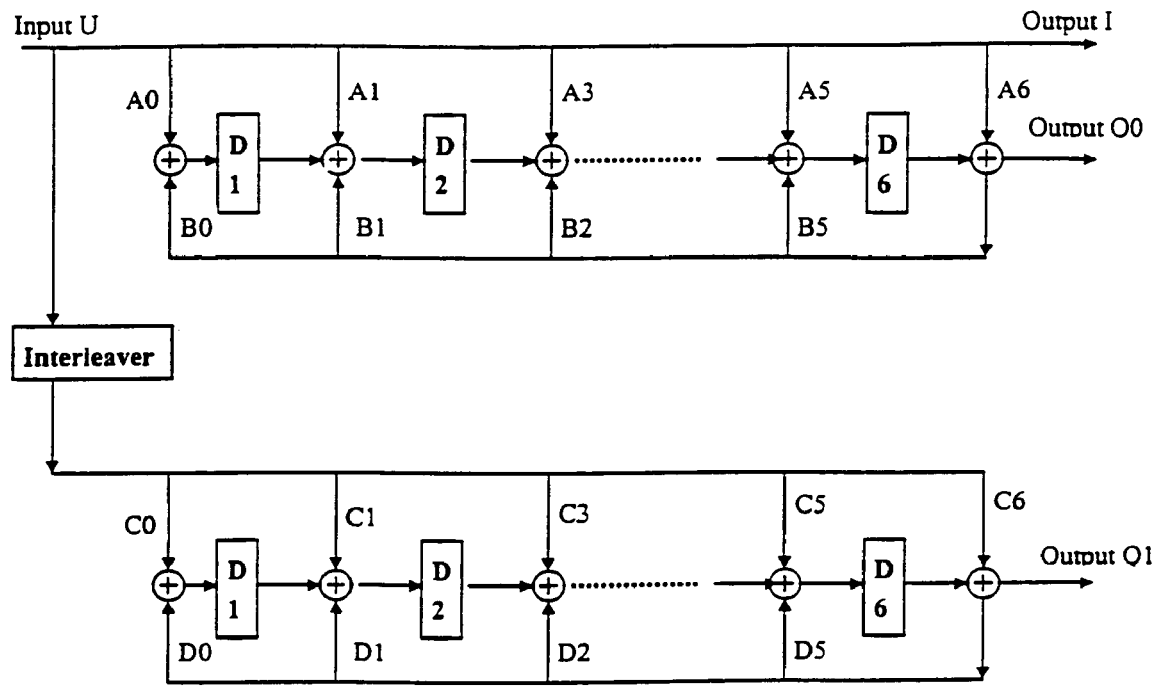
FIG. 13 illustrates a rate one-half concatenated, systematic convolutional Turbo code generator.

The rate ½ parallel concatenated systemic convolutional Turbo code for QPSK symbol constellations is shown in FIG. 13. In FIG. 13, the An, Bn, Cn and Dn, n=0, 1, 2, . . . , 5, and 6, are the coefficients of the encoder which are defined as follows:

A0=0 A1=1, A2=1, A3=1, A4=0, A5=1, A6=0,
B0=1, B1=0. B2=0 B3=1, B4=0. B5=0,
C0=0, C1=1, C2=1, C3=1, C4=0, C5=1, C6=0.
D0=1, D1=0, D2=0, D3=1, D4=0, D5=0

One input bit U will generate two output bits, I and Q, of a QPSK symbol. The output Q bit will be selected from Q0 and Q1 alternately.

The random interleaver is a block interleaver with block size as 1248 bits.

TABLE 5

| Symbol Mapping for 16QAM | | | | |
| --- | --- | --- | --- | --- |
| Symbol Level | 0 | 1 | 2 | 3 |
| Bit vector | 00 | 01 | 10 | 11 |

2.4.2 Inter Codes for 16QAM Symbol Constellations 2.4.2.1 Rate ½ Trellis Code

A 16-state rate ½ trellis encoder, as shown in FIG. 12, is used as the inner code of the concatenated codes for 16QAM symbol constellation.

The input byte is first converted into four two-bit pairs with LSB first. Then a two-bit pair is encoded into two two-bit pairs for 16QAM symbol mapping, which is indicated as I and Q two-bit pairs. As shown in the block diagram, the output bit I1 is the direct mapping of the input bit U0, and the output Q1 is the direct mapping of the input bit U1.

Figure 14:
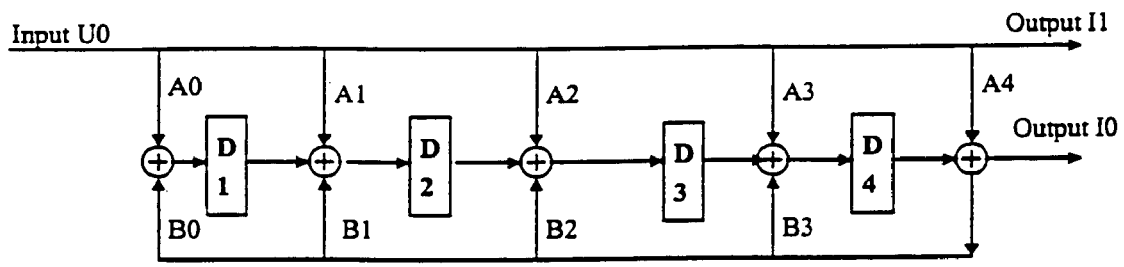
FIG. 14 illustrates a rate one-half trellis encoder used for 16QAM symbol constellations.
Figure 14:
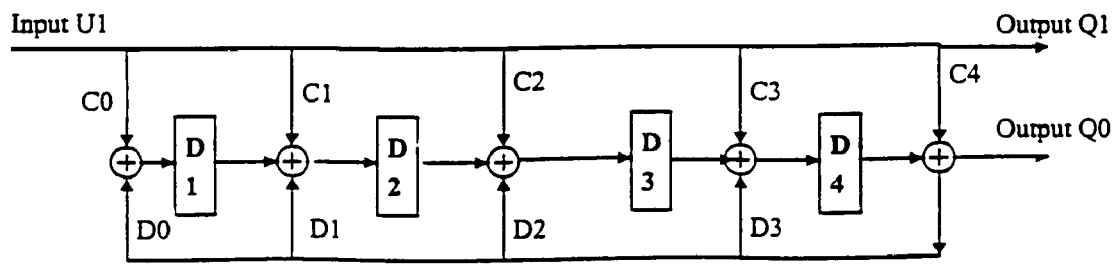

In FIG. 14, the An, Bn, Cn and Dn, n=0, 1, 2, 3 and 4, are the coefficients of the encoder which are defined as follows:

A0=0, A1=2, A2=1, A3=1, A4=0.
B0=1, B1=0, B2=0, B3=1,

C0=0, C1=1, C2=1, C3=1, C4=0,
D0=1, D1=0, D2=0, D3=1.

The output symbol mapping, from a two-bit vector to a four-level symbol, uses natural mapping as specified in Table 3. This symbol scheme applies to both I and Q channels of 16QAM.

TABLE 6

Symbol Mapping for 64QAM

| Symbol level | 0 | 1 | 2 | 3 | 4 | 5 | 6 | 7 |
|---|---|---|---|---|---|---|---|---|
| Bit vector | 000 | 001 | 010 | 011 | 100 | 101 | 110 | 111 |

2.4.2.2 Rate ½ Parallel Concatenated Trellis Turbo Code

Figure 15:
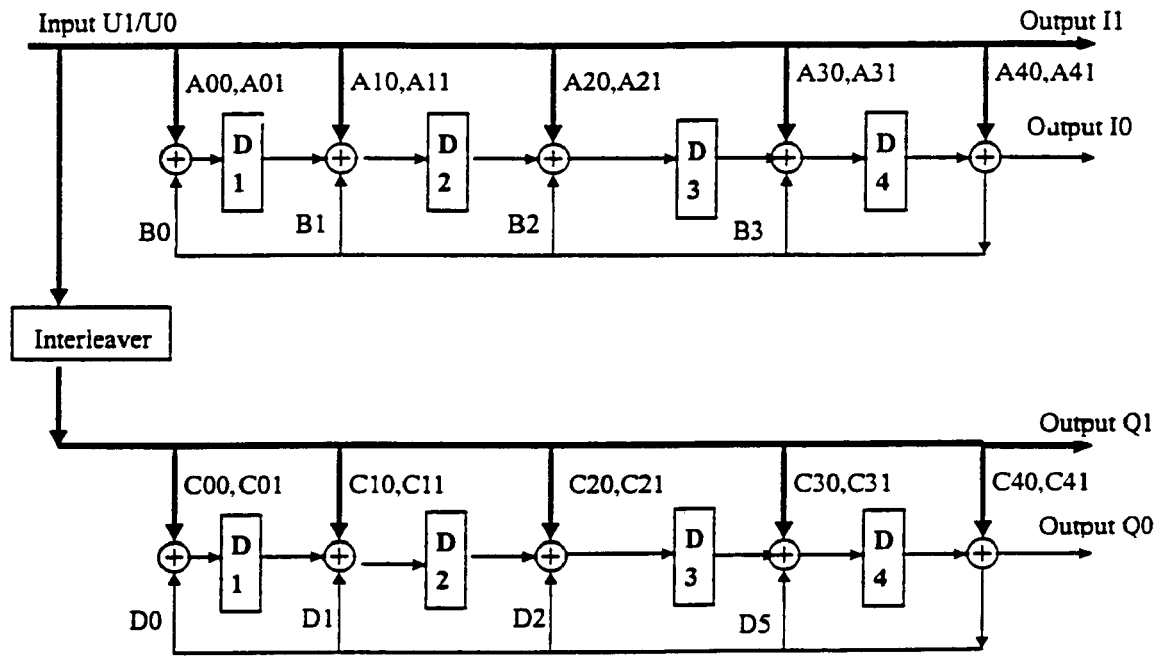
FIG. 15 illustrates a parallel concatenated trellis code Turbo encoder for a 16QAM.

The Parallel Concatenated Trellis Turbo Code (PCTTC) encoder is shown in FIG. 15. The block diagram shown in FIG. 15 is very similar to the block diagram in FIG. 11. The input stream conversion and the output symbol mapping are the same for both the trellis encoders.

For a PCTC Turbo encoder, there is a bit interleave module between the two parallel constituent encoders. The bit interleave module performs the bit permutation of a given data block. The data block should be within one Signal Frame.

In FIG. 15, the An, Bn, Cn and Dn, n=0, 1, 2, and 3, are the coefficients of the PCTC Turbo encoder. Here, the An and Cn are two-bit vectors. The coefficients are defined as follows:
  A01=1, A11=1, A21=0, A31=1,
  A00=0, A10=1, A20=0, A30=0.
  B0=1, B1=0, B2=1,
  C01=1, C11=1, C21=0, C31=1,
  C00=0, C10=1, C20=0. C30=0,
  D0=1, D1=0. D2=1.

The symbol mapping of a PCTTC encoder for 16QAM is the same as in Table 5.

The random interleavers are two block interleavers with block size as 1248 bits.

2.4.3 Inner Codes for 64QAM Symbol Constellations 2.4.3.1 Rate ⅔ Trellis Code

Figure 16:
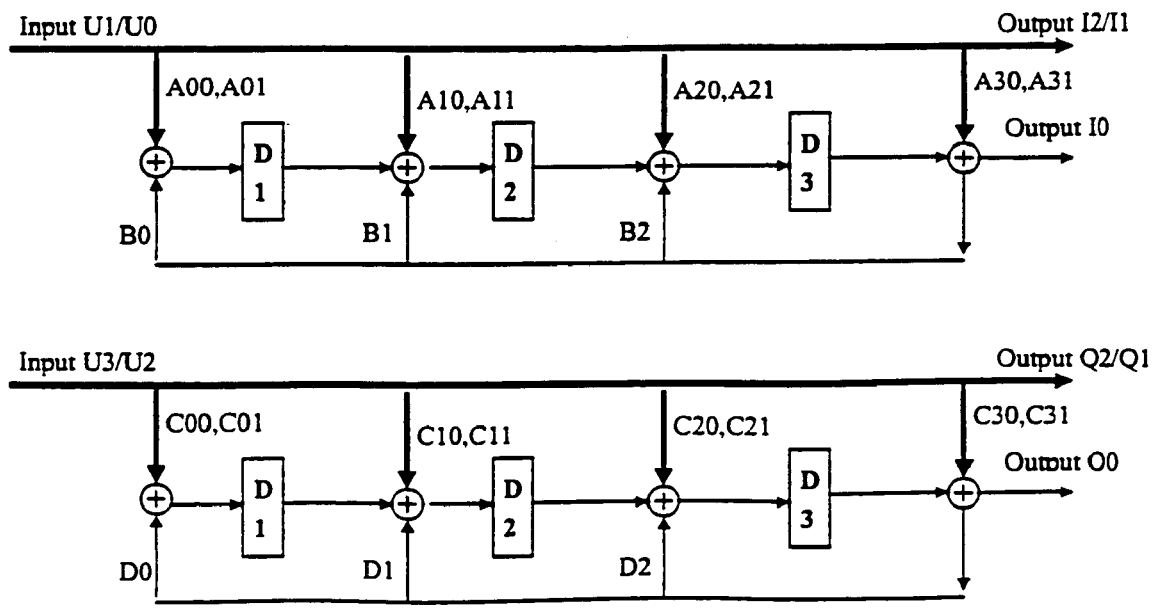
FIG. 16 illustrates a two-third rate trellis encoder used for 64QAM symbol constellations.

An 8-state rate, ⅔ trellis encoder, as shown in FIG. 16, is used as the inner code of the concatenated codes for 64QAM symbol constellation.

The input byte is first converted into two four-bit vectors with LSB first. Then the four-bit vector is encoded into two three-bit vectors for 64QAM symbol mapping, which is indicated as I and Q three-bit vectors. As shown in the block diagram, the output bit $^{12}/_{11}$ is the direct mapping of the input bit U1/U0, and the output Q2/Q1 is the direct mapping of the input U3/U2.

In FIG. 16, the coefficients An, Bn, Cn and Dn (n=0, 1, 2, 3), are defined as follows.
  A01=0. A11=1, A21=1, A31=0,
  A00=0. A10=1, A20=0, A30=0,
  B0=1, B1=0, B2=1,
  C01=0, C11=1, C21=1, C31=0,
  C00=0, C10=1, C20=0. C30=0,
  D0=1, D1=0, D2=1.

The output symbol mapping from a three-bit vector to an eight-level symbol uses natural mapping as specified in Table 8. I and Q channels of the 64QAM have the same symbol mapping scheme.

TABLE 6

Symbol Mapping for 64QAM

| Symbol level | 0 | 1 | 2 | 3 | 4 | 5 | 6 | 7 |
|---|---|---|---|---|---|---|---|---|
| Bit vector | 000 | 001 | 010 | 011 | 100 | 101 | 110 | 111 |

2.4.3.2 Rate ⅔ Parallel Concatenated Trellis Turbo Code

Figure 17:
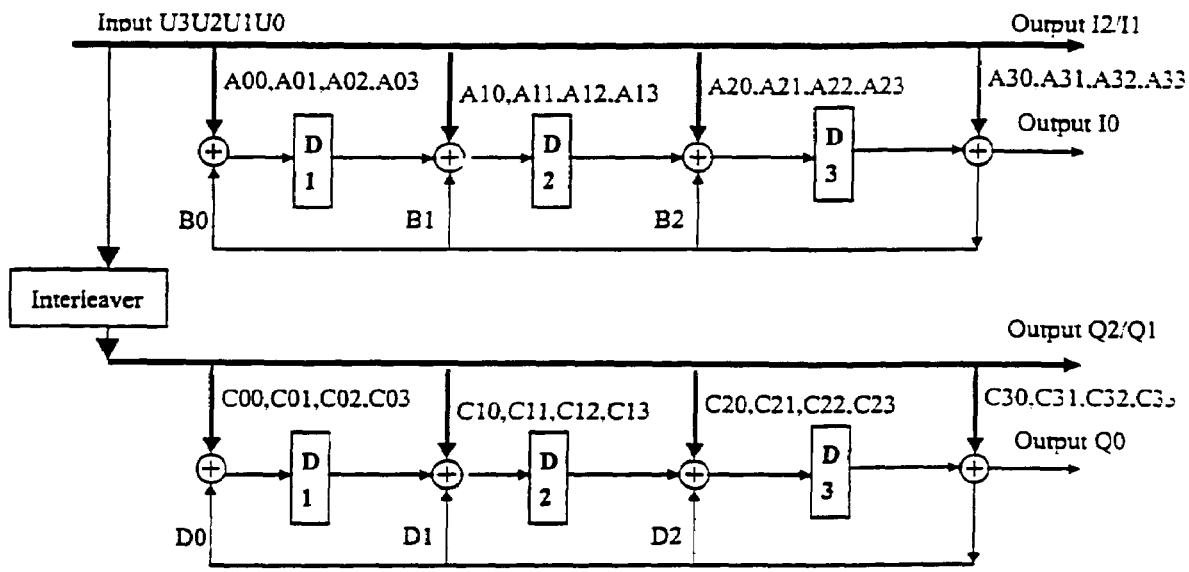
FIG. 17 illustrates a Parallel Concatenated Trellis code Turbo encoder used for 64QAM symbol constellations.

The Parallel Concatenated Trellis Turbo Code (PCTTC) encoder is shown in FIG. 17. The block diagram shown in FIG. 17 is very similar to the block diagram in FIG. 16. The input stream conversion and the output symbol mapping are the same for both the trellis encoders.

Similar to the situation for 16QAM, there is an interleave module between the two parallel constituent encoders in the PCTTC encoder for 64 QAM. The coefficients in FIG. 17 are defined as follows:
  A00=0. A10=1, A20=0. A30=0,
  A01=0. A11=1, A21=1. A31=0,
  A02=1, A12=0, A22=0. A32=1,
  A03=0. A13=1, A23=1, A33=1,
  B0=1, B1=0, B2=1,
  C00=0, C10=1, C20=0. C30=0.
  C01=0. C11=1, C21=1, C31=0,
  C02=1, C12=0. C22=0. C32=1,
  C03=0. C13=1, C23=1, C33=1,
  D0=1 D1=0. D2=1.

The symbol mapping of PCTTC encoder for 64QAM is the same as in Table 6.

The random interleavers are four block interleavers with block size as 1248 bits.

2.4.4 Concatenated Codes

Based on the above-described building blocks, there are many configurations of the concatenated codes for different applications purposes. All the configurations should be supported by the transmission network base station equipment. For terminal devices, some of the configurations are mandatory and some are optional, depending on the device applications.

The boundaries of the concatenated codes are different for different configurations. The type of the concatenated codes can only be changed at the boundaries. For some concatenated codes, one data block is the boundary. For some other codes, one Symbol Set is the boundary. For a continuous data stream, the boundary of some concatenated codes may extend over several Signal Frames.

2.4.5 Time Interleaving (Optionally Included)

Another convolutional interleaver may be added after Trellis/Turbo encoder of the FEC block in order to support a mobile application.

3. Time Domain Synchronized OFDM (TDS-OFDM) RF Modulation 3.1 OFDM Principle

Because echo interference and linear distortion occur in signal transmission, inter-symbol interference (ISI) will exist between received symbols. Presently, there are two methods to eliminate ISI: time domain equalization and Orthogonal Frequency Division Multiplexing (OFDM). Generally, a time equalizer includes a transverse filter that follows a match filter. A filter consists of delay lines with many taps with tap intervals equal to one symbol period, and tap coefficients may be adjusted to eliminate ISI. This is similar to a finite impulse response (FIR) filter. The effect of equalization is primarily decided by the tap number and equalization algorithm(s)

used. The equalizer has preset code and an adaptive mode. Noise interference will exist in a practical channel, which may influence the convergence of the equalizer. For improved performance, a Decision Feedback Equalizer (DFE) is used for equalization in a practical application. The DFE causes a very small noise enhancement, but it also results in a very sharp Bit Error Rate (BER) threshold because of the error feedback.

An ATSC receiver is implemented in the DFE equalizer, and digital 8-level VSB is chosen as ATSC modulation scheme.

An equalizer has been widely used for various telecommunications, but it has two disadvantages: a more complex structure and higher cost. Equalization has good effects only for short delay ISI, and worse effects for long delay ISI. Here, it is better to use OFDM technology.

The effect of ISI effect becomes serious when ISI time delay is identical with symbol period. Hence, transmission symbol period is extended to eliminate or reduce ISI effect; that is, an OFDM principle is applied to reduce ISI effects.

OFDM consists of plentiful sub-carriers (assumed the total is N), each carrier usually chooses the same or different modulation. Series transmission symbol sequence is also divided into a group with length equal to N. N symbols in a group are modulated by N sub-carrier, respectively, and then are transmitted together. Therefore, OFDM is substantially a parallel modulation which extends symbol period to N times, hence improves the capability against ISI effect.

A key to OFDM use is how to choose the intervals between sub-carriers. In conventional Frequency Division Multiplexing (FDM), signal spectra on each carrier do not overlap each other so that a receiver can use filters to separate carriers from each other. In this way, spectrum efficiency will be reduced. For improved spectrum efficiency in OFDM modulation, signal spectra for adjacent carriers can overlap each other, but these carriers are orthogonal in a whole symbol period by selecting an appropriate carrier interval. In this way, even if an alias is present between signal spectra, signals can be recovered without error. It is well-known that the orthogonality condition can be satisfied when minimum carrier interval is equal to the reciprocal of symbol period.

Figure 18:
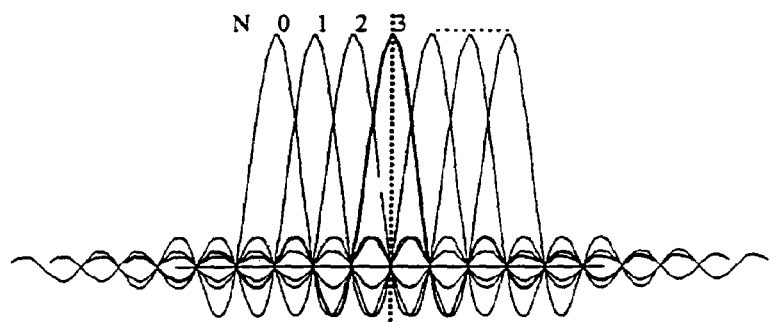
FIG. 18 shows a spectrum of an OFDM signal.

When a symbol consists of rectangular impulses, the shape of each carrier spectrum is $sin(x)/x$, with spectral peaks of one carrier coinciding with zeroes of another carrier's spectrum, as shown in FIG. 18.

Because each carrier duration is spread by N times, which is even longer than normal ISI, OFDM can robustly withstand the presence of ISI.

Because an OFDM system has thousands of sub-carriers, the system cannot use thousands of Phase Lock Loops (PLLs) or oscillators as a conventional method to implement OFDM modulation. By mathematical analysis, it has been discovered that OFDM can be performed using Discrete Fourier Transforms (DFT) or Fast Fourier Transforms (FFT). Using IDFT, N input data are transformed into N time domain samples that OFDM requires. After digital to analog conversion, an OFDM signal waveform is obtained. This OFDM signal is up-converted to an RF carrier.

Figure 19:
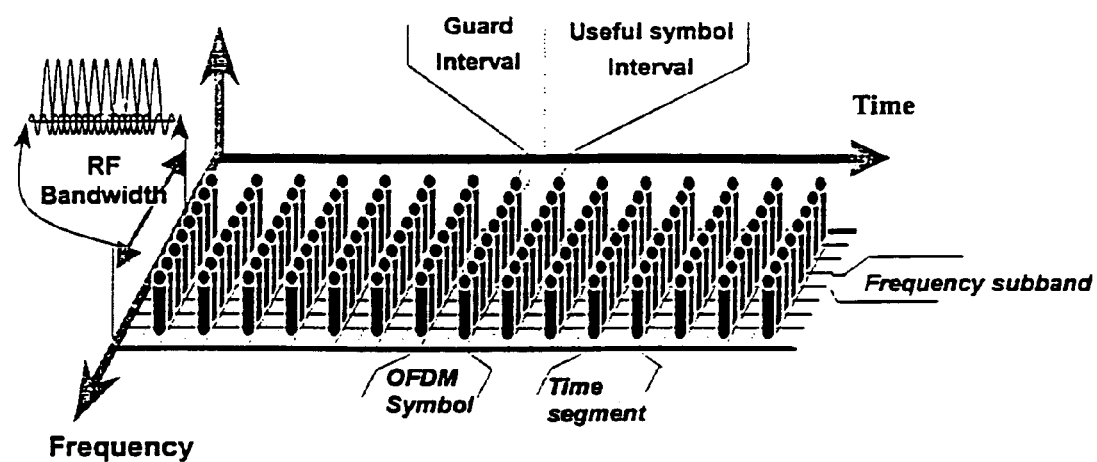
FIG. 19 shows a signal region and guard interval for an OFDM signal.

But when ISI exists in a transmission channel, OFDM sub-carrier orthogonality condition will be destroyed; and a receiver cannot correctly recover symbols modulated on each sub-carrier. Therefore, a guard interval is added to the DFT time domain block: and OFDM transmission duration becomes $Ts=Tu+L$ as indicated in FIG. 19.

The signal in a guard interval is formed by periodic widening of an OFDM signal. When ISI delay does not exceed the guard interval length L, an OFDM sub-carrier orthogonality condition should be maintained; the OFDM signal is interfered with minimally by the ISI effect. The capability of OFDM to withstand ISI depends on the length L of the guard interval: the larger L is, the more ISI delay range can be withstood. But note that valid information is transmitted in the guard interval, so the larger the guard interval length L, the more a spectrum resource is wasted. This is a cost of using OFDM that withstands the, presence of ISI.

European DVB-T system uses Code OFDM (COFDM) modulation. In an OFDM data frame, all sub-carriers use the same QPSK, 16QAM or 64QAM modulation. Because DVB-T is designed for an 8 MHz bandwidth terrestrial TV channel, OFDM symbol spectrum's bandwidth doesn't exceed 8 MHz. OFDM transmission frame consists of three layers; an OFDM symbol consists of K carriers with duration Ts. For 2k mode, k=1705; for 8k mode, k=6817. Ts consists of valid duration Tu and guard interval length L. An OFDM frame includes 68 OFDM symbols, with symbol duration Tr. An OFDM super frame consists of 4 OFDM frames.

A DVB-T system specifies four guard intervals, with length equal to mT, where m is an integer and T is OFDM time domain sampling period. For 8k mode, maximal guard interval length L can be up to 200 μsec; for 2k mode, the maximal guard interval is more than 50 μsec.

COFDM system randomly inserts some pilot signals in the COFDM spectrum. These pilot signals are OFDM carriers modulated by data known at the receiver. The pilot signals carry some transmitter parameters or data used for evaluating channel characteristics.

Figure 20:
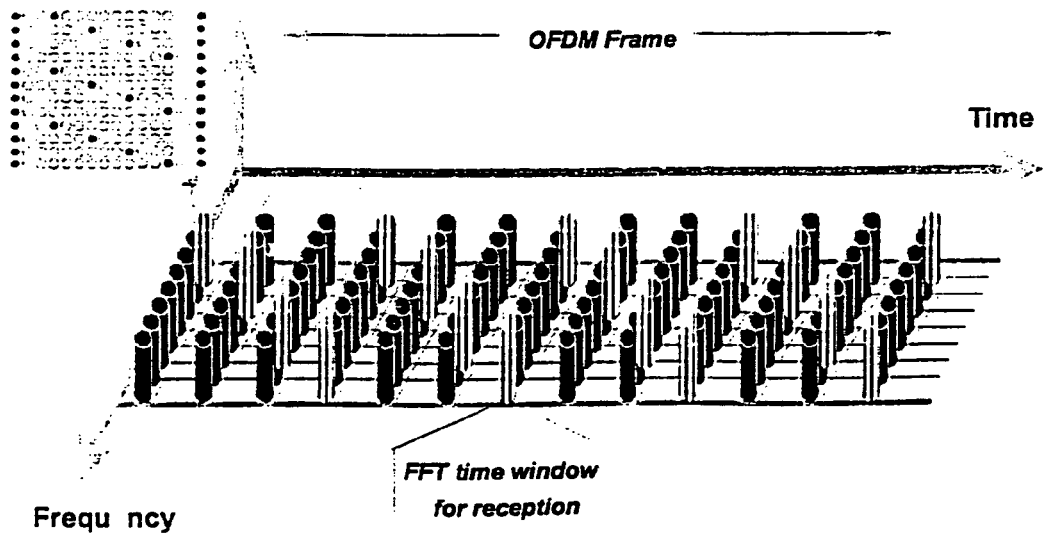
FIG. 20 shows a pilot signal position of COFDM in a DVB-T system.

Pilot signals are very important in the COFDM system and are used for frame sync, frequency sync, timing sync, channel estimation, transmission mode identifiers, phase noise track, etc. DVB-T allows use of continuous pilot signals and scattered pilot signals. The 2k mode has 45 continuous pilots, and the 8k mode has 177 continuous pilots. Continuous pilot signals have fixed positions. Scattered pilot signals have different positions in different COFDM symbols, and the period is equal to 4 COFDM frames, as shown in FIG. 20.

However, the carrier number that is used for carrying valid information is invariant; 2k mode has 1512 and 8k mode has 6048.

COFDM, because it has the features discussed in the preceding, has some advantages, including the following: (1) withstanding multipath distortion; (2) support mobile reception; and (3) forming single frequency network (SFN).

But FFT and pilot signals require each other in COFDM system. Pilot signals are added after an FFT process; but an FFT process first needs to recover timing (using a pilot signal), before the FFT process begins. Hence, COFDM uses an iterative algorithm, so there are problems on convergence error and convergence time.

3.2 Time Domain Synchronous OFDM (TDS-OFDM) Modulation

Multi-carrier modulation (OFDM) is used in this invention, but it is very different from European COFDM. This invention uses time domain synchronous OFDM modulation, which has the advantages of OFDM but overcomes the European COFDM disadvantages. In the TDS-OFDM, there are no COFDM pilot signals; a PN spread spectrum sequence is added to the Signal Frame as a time domain sync signal to be used for frame sync, timing sync, channel estimation, phase noise tracking, etc.

The PN sequence is spread using a Walsh code and has the following PN spread spectrum sequence advantages: (1) robust standing against noise (lower SNR thresholds); (2) robust standing against interference; (3) robust standing against fading; and (4) CDMA (Code Division Multi Address) can be used for implementing cell telecommunications.

Figure 21:
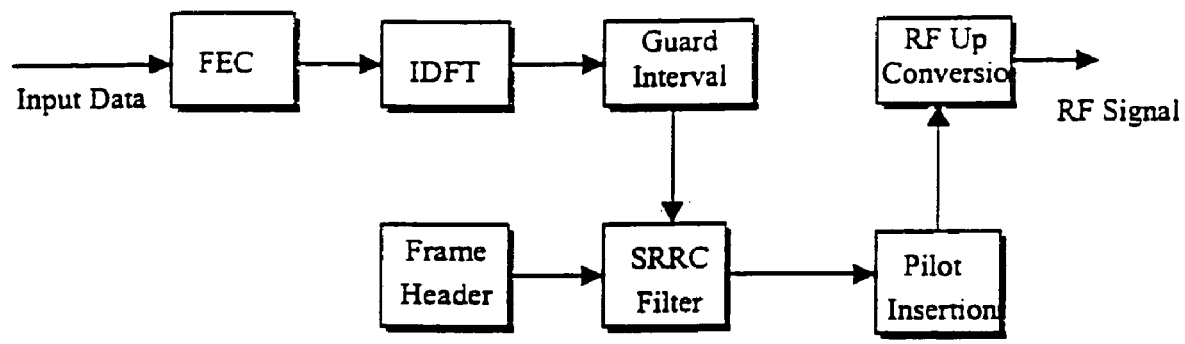
FIG. 21 shows a flow chart illustrating a down link RF modulation procedure according to the invention.
Figure 22:
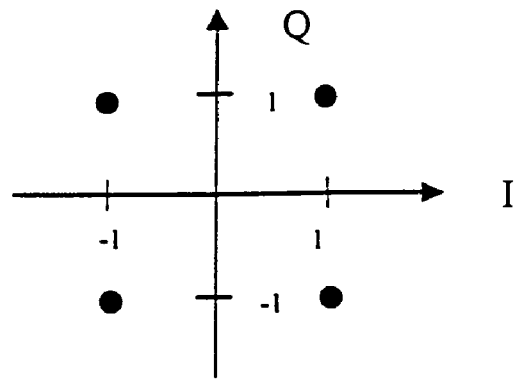
FIG. 22 shows a QPSK symbol constellations.
Figure 23:
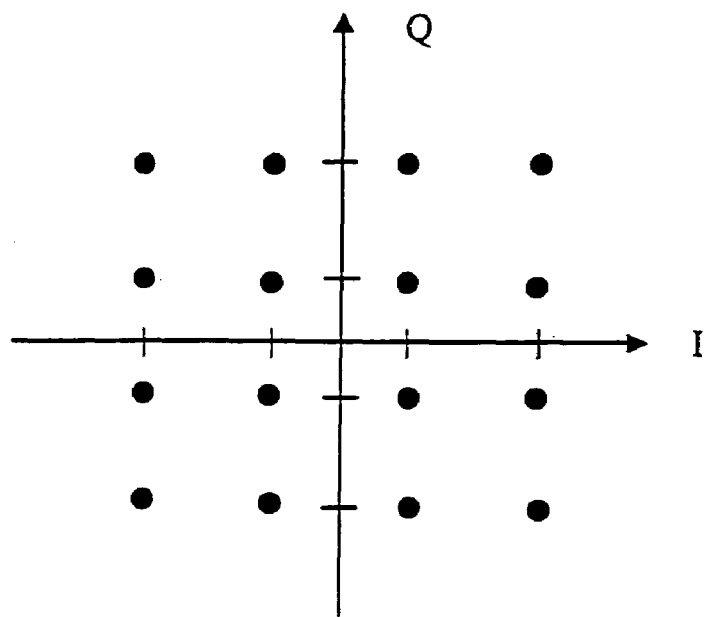
FIG. 23 shows a uniform 16QAM symbol constellations (=1).
Figure 24:
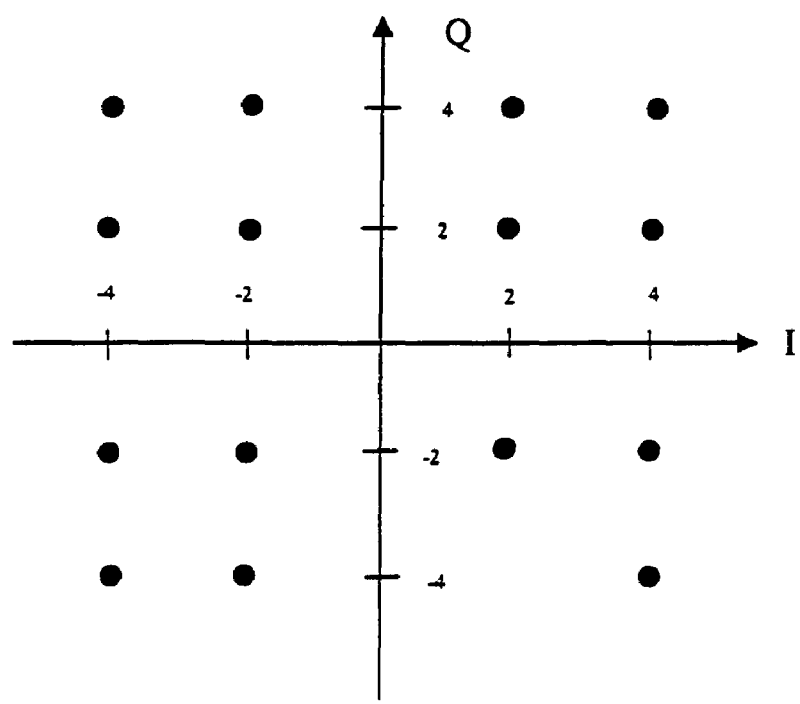
FIG. 24 shows a non-uniform 16QAM symbol constellations (=1).
Figure 25:
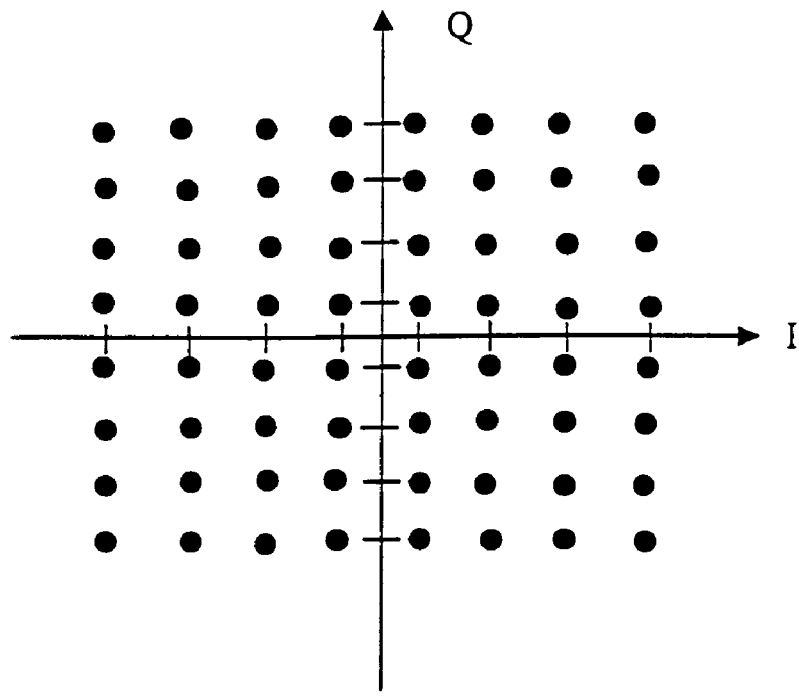
FIG. 25 shows a uniform 64QAM symbol (=1).
Figure 26:
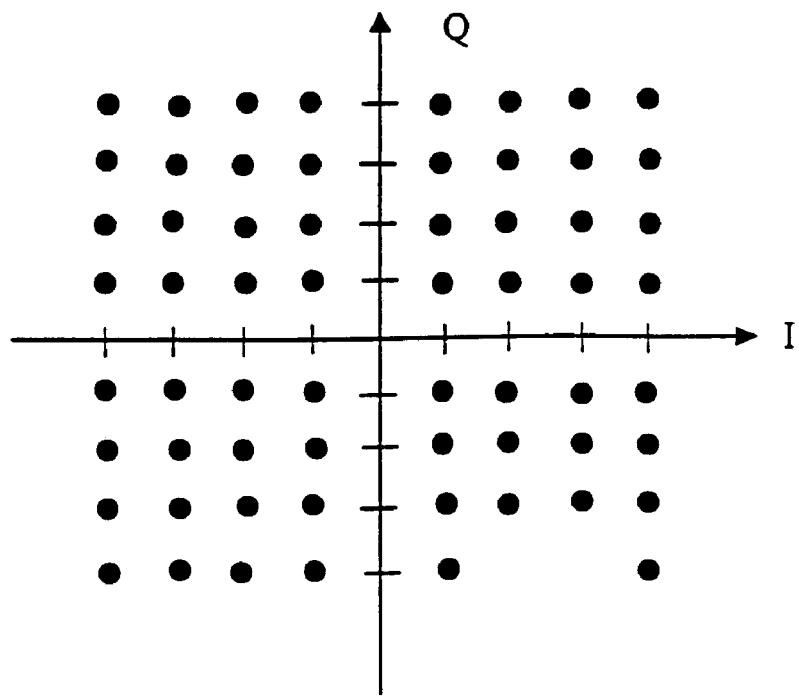
FIG. 26 shows a non-uniform 64QAM symbol constellations (=1).
Figure 27:
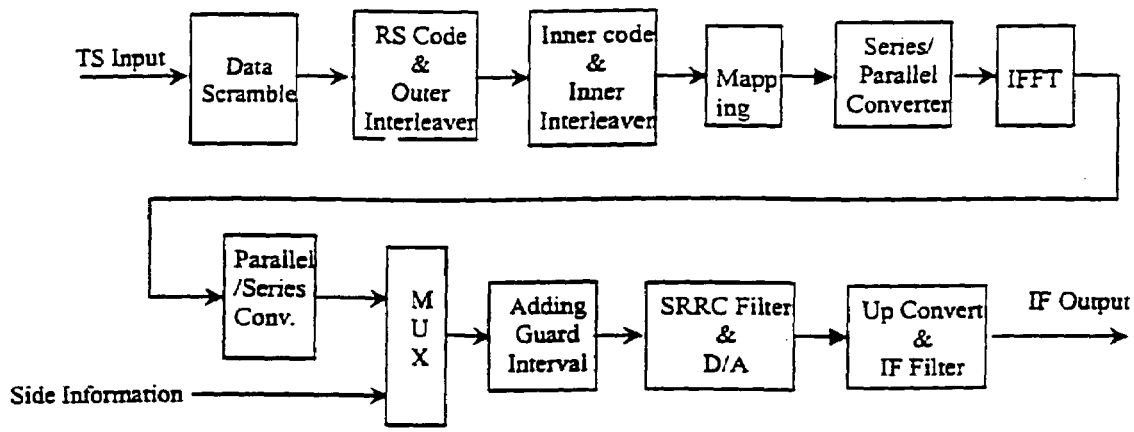
FIGS. 27a and 27b show a system transmission structure.
Figure 27:
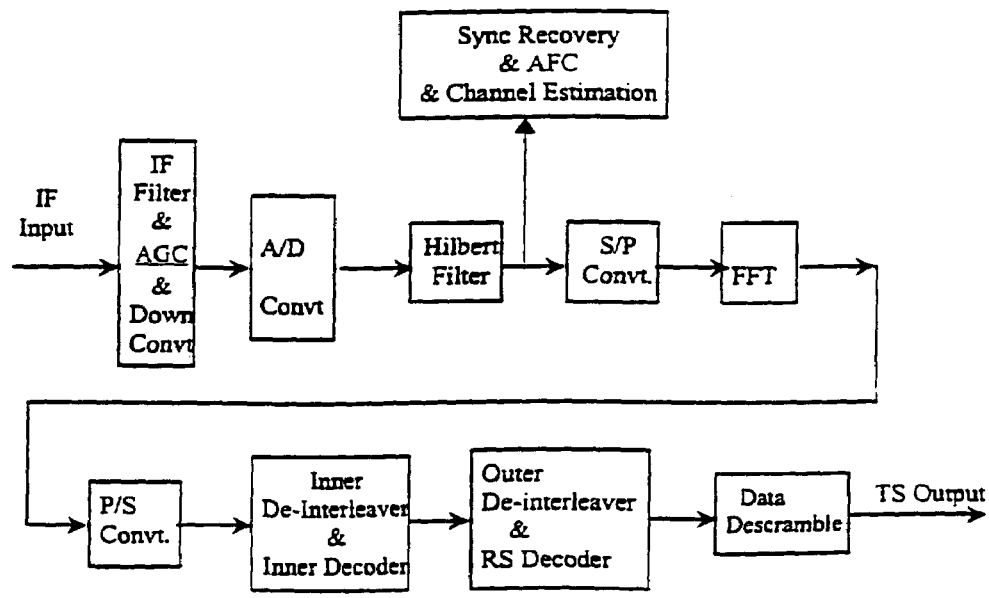

The synchronized OFDM RF modulation uses the following procedure: (1) Form the DFT data block in frequency domain after FEC processing; (2) Transform the DFT data block into time domain discrete samples using IDFT; (3) Add the guard interval to the DFT time domain block to form the Frame Body; (4) Combine the Frame Header and the Frame Body to form a Signal Frame; (5) Conduct pulse shaping using a Square Root Raised Cosine (SRRC) filter; and (6) Up-convert the baseband Signal Frame to an RF carrier. This procedure is illustrated in FIG. 21.

The output data from an FEC block and the Frame Group Number will be used to form a Discrete Fourier Transform (DFT) block.

A DFT block consists of 3780 frequency sub-carriers, and the frequency interval between two consecutive sub-carriers is 2 KHz. Therefore, the bandwidth of the bandpass information signal is 7.56 MHz. The complex frequency sub-carrier format can be QPSK, 16QAM and 64QAM.

A DFT block is formed, first in the frequency domain, and transferred to the time domain before RF modulation. The discrete Fourier transform can be performed by using an inverse Fast Fourier Transform (IFFT) program. The composite number 3780 can be factored as decomposition.

The time domain DFT block can be represented by 3780 samples, also called Nyquist samples, which are the minimum number of samples needed to recover the frequency domain sub-carriers.

In order to support hierarchical modulation, a symbol can have 2, 4, or 6 bits of data corresponding to a symbol format of QPSK, 16QAM/non-uniform-16QAM, or 64QAM/non-uniform-64QAM.

QAM constellation diagrams are shown in the following figures. The distance between the constellation points is determined by the modulation parameter $\alpha$ which is defined as the ratio of the distance between two neighboring constellation points of two quadrants and the distance between two neighboring constellation points within one quadrant. Three values for this parameter are defined: $\alpha=1$ for uniform mapping; and $\alpha=2$ and $\alpha=4$ for non-uniform mapping.

Within a symbol set, the symbol constellation should be the same. Within a Signal Frame, different symbol constellations may be used for different symbol sets.

The symbols in an IDFT block are interleaved with size 3780.

A guard interval is added to the time domain DFT block to form the Frame Body. There are five operational modes for the guard interval, which are defined as $1/6$, $1/9$, $1/12$, $1/20$ and $1/30$ of the DFT block size. The last segment of the samples of the time domain DFT block will be used as the samples in the guard interval.

The Frame Sync sequence will be prefixed to the Frame Body to form a Signal Frame. The Frame Sync signal power will be boosted by 6 dB from the average power of the Frame Body signal power. A Square Root Raised Cosine (SRRC) filter will be used for the baseband pulse shaping. The parameter of the SRRC filter is defined as 0.05.

The synchronized PN pilot-assisted, and OFDM-modulated RF signals can be represented by the following formula:

$$S(t) = Re\{\exp(2\pi F_c t) U(t)\},$$

S(t)=RF signal,
$F_c$=carrier frequency, $$U(t) = \text{pulse shaped baseband signal}$$
$$= P(t) * \{PN(n) + GI(n) + IDFT(n)\}.$$

P(t)=pulse shaping function of the SRRC filter,
PN(n)=nth sample of PN sequence of a frame header,
GI(n)=guard interval nth sample,
IDFT(n)=IDFT block nth sample.

Figure 4:
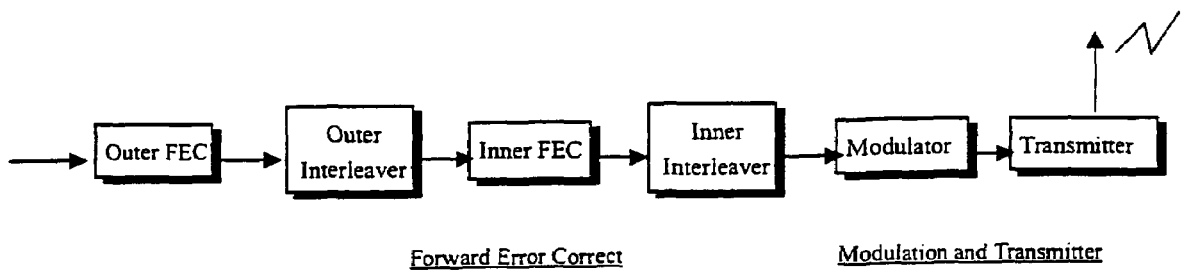
FIG. 4 illustrates a transmission layer of a DMB-T system.

Note that PN(n), GI(n) and IDFT(n) are mutually exclusive in time, as shown in FIG. 4.

3.3 Other Approaches 3.3.1 Broadcasting Packets

Broadcasting Packets are used to transmit control and data information to all the devices of a radio link network. Broadcasting Packets will be used for broadcasting the transmission parameters such as the symbol constellation, the FEC code block size, the logic channel mapping and the radio link configuration.

A Broadcasting Control Packet must be sent in the Signal Frame of a Frame Group header. It is always allocated as the first block of the Symbol Set 0. A Broadcasting Control Packet should not be changed within a Super Frame.

The Broadcasting Control Packet consists of a set of Broadcasting Control Elements (BCEs). A BCE describes the physical transmission parameters for an RS-encoded data block. The BCE format is defined as in Table 7.

TABLE 7

| Broadcasting Control Element Format | | | | | | | |
|---|---|---|---|---|---|---|---|
| BS | MT | SS1 | SS0 | DB3 | DB2 | DB1 | DB0 |
| EP1 | EP0 | INT1 | INT0 | FEC1 | FEC0 | MOD1 | MOD0 |

BS=Burst Stream, 0 refers to continuous steam; 1 refers to burst stream
MT=Multiple Transmission; 0 refers to single base station transmission, 1 refers to multiple base station transmission
SS1, SS0=Symbol Set numbers
DB3, DB2, DB1, DB0=Data Block number for an RS encoded block
EP1, EP0=Base station Emission Power (EP) classes
INT1, INT0=Interleaving (INT) modes for inter/intra frames
FEC1, FEC0=FEC code types for RS codes and Turbo code
MOD1, MOD0=Modulation (MOD) types The Data Block numbers in a BCE is related to other parameters of the BCE, such as the MOD type and the FEC code.

The Broadcasting Control Packet is defined as in Table 8.

TABLE 8

| Broadcasting Control Packet Format | | | | | | | |
|---|---|---|---|---|---|---|---|
| T3 | T2 | T1 | T0 | L3 | L2 | L1 | L0 |
| BS | MT | INT1 | INT0 | FEC1 | FEC0 | MOD1 | MOD0 |
| ... | ... | ... | ... | ... | ... | ... | ... |

TABLE 8-continued

Broadcasting Control Packet Format

| BS | MT | SS1 | SS0 | DB3 | DB2 | DB1 | DB0 |
|----|----|----|----|-----|-----|-----|-----|
| EP1 | EP0 | INT1 | INT0 | FEC1 | FEC0 | MOD1 | MOD0 |

T3, T2, T1, T0 = type ID
L3, L2, L1, L0 = length of the Broadcasting Control Packet, defined as the number of BCEs in the packet.

The Broadcasting Control Elements (BCEs) in the Broadcasting Control Packet (BCP) have priorities in order of the Symbol Set numbers and the Data Block numbers. The first BCE entry should be put into BCP for the first data block of Symbol Set 0. Then in the order of the data block number for Symbol Set 0, a new BCE entry should be added if the data block parameters (except DB number) are different from those of the last BCE entry of the BCP. Symbol Set 1 and Symbol Set 2 are treated similarly to complete the BCP.

Broadcasting Data Packet (BDP) is a 188-byte packet. The first byte of a BDP is a type ID. If the first byte is an MPEG sync byte, 47H or its inversion, the following 187 bytes of the packet are MPEG TS packet. If the type ID of a BDP is not an MPEG sync byte, an application data packet, (e.g., Internet data packet) is encapsulated in the BDP.

3.3.2 Paging Packets

Paging Packets will transmit information to users with unknown locations. Paging Packets are used for wakeup control, mobile terminal allocation, conventional paging service, etc. Paging Packets are sent in the entire Single Frequency Cellular Network. A Paging Packet includes a Page Header Packet and a Page Message Packet.

A Page Header Packet (PHP) is used to wake up the target device for receiving the following paging message. A PHP format is set forth in Table 9. The length of a PHP varies from 3 bytes to 16 bytes. A PHP is sent only in the Signal Frame of a Frame Group Header.

TABLE 9

Page Header Packet Format

| T3 | T2 | T1 | T0 | L3 | L2 | L1 | L0 |
|----|----|----|----|-----|-----|-----|-----|
| SF8 | FGD | SS1 | SS0 | DB3 | DB2 | DB1 | DB0 |
| SF7 | SF6 | SF5 | SF4 | SF3 | SF2 | SF1 | SF0 |
| AD7 | AD6 | AD5 | AD4 | AD3 | AD2 | AD1 | AD0 |
| AD15 | AD14 | AD13 | AD12 | AD11 | AD10 | AD9 | AD8 |
| ... | ... | ... | ... | ... | ... | ... | ... |
| AD103 | AD102 | AD101 | AD100 | AD99 | AD98 | AD97 | AD96 |

T3, T2, T1, T0 = 4-bit Page Header type
L3, L2, L1, L0 = address length of the target device, maximum address size is 13 bytes, minimum address size is zero byte.
DB3, DB2, DB1, DB0 = start Data Block (DB) number for the target device
SS1, SS = Symbol Set (SS) number
FGD = Frame Group Delay; 0 indicates that paging message is in current Frame Group; 1 indicates that paging message is in the next Frame Group
SF8-SF0 = Signal Frame (SF) number
AD103-AD0 = target device address (AD); maximum size is 13 bytes and minimum size is 0 bytes.

The Page Message Packet format is defined as in Table 10.

TABLE 10

Page Message Packet Format

| T3 | T2 | T1 | T0 | F3 | F2 | F1 | F0 |
|----|----|----|----|-----|-----|-----|-----|
| L7 | L6 | L5 | L4 | L3 | L2 | L1 | L0 |
| SF8 | FGD | SS1 | SS0 | DB3 | DB2 | DB1 | DB0 |
| SF7 | SF6 | SF5 | SF4 | SF3 | SF2 | SF1 | SF0 |
| D7 | D6 | D5 | D4 | D3 | D2 | D1 | D0 |
| D15 | D14 | D13 | D12 | D11 | D10 | D9 | D8 |

T3, T2, T1, T0 = PMP type ID
F3, F2, F1, F0 = Flag values,
F0 = 0: the page message is not finished at the end of this packet
F0 = 1: the page message is finished at the end of this packet
F1 = 0: the following packet if any is the next data block
F1 = 1: the following packet if any is in the specified data block
F2 = 0: the packet is a full data block
F2 = 1: the packet is a partial data block with the specified size
F3 (next frame) = 0: all data blocks are in the current signal frame
F3 = 1: all data blocks will continue to the next signal frame
L7-L0 = number of data bytes in this packet; this byte is only needed when the F2 is set equal to 1
DB3, DB2, DB1 DB0 = start Data Block (DB) number for the target device; only necessary when F1 is set to 1
FGD (Frame Group Delay)
FGD = 0: the following data blocks are in current Frame Group
FGD = 1: the following data blocks are in the next Frame Group; only needed when F3 is set equal to 1
SS1, SS0 = Symbol Set (SS) number, only necessary when F1 is set equal to 1
SF8-SF0 = Signal Frame (SF) number; only necessary when F3 is set equal to 1

An unneeded byte is not included in the packet so that packet size may vary.

3.3.3 Unicast Packets

A Unicast Packet sends control and data information to a single user or a group of users from one base station. Before sending a Unicast Packet, the target device location should be known to the network.

A Unicast Header Packet (UHP) is used to wake up the target device for receiving the coming data packets. A UHP is defined the same as the Paging Header Packet as shown in Table 9. The first four bits of a UHP is the UHP type ID.

The Unicast Data Packet (UDP) carries data information for the target device. A UDP format is the same as the Paging Message Packet as shown in Table 10. The first four bits of a UDP is the UDP type ID.

3.3.4 Multicast Packets

A Multicast Packet sends control and data information to a single user or a group of users from multiple base stations of the SFCN. Before sending a Multicast Packet, the target device location should be known to the network. Multicast Packets are designed for users with high mobility and for users at the boundaries of the SFCN cells.

A Multicast Header Packet (MHP) is used to wake up the target device for receiving the coming data packets. An MHP is the same as the Paging Header Packet as shown in Table 9. The first four bits of the MHP is the MHP type ID.

A Multicast Data Packet (MDP) carries data information for the target device. An MDP format is the same as the Paging Message Packet as shown in Table 10. The first four bits of the MDP is the MDP type ID.

3.4 Description of An Implemented Example of the Invention

In the preceding, the system functions and basic principles were introduced. FIGS. 27-31 illustrate a concrete implementation of terrestrial digital multimedia television broadcasting system according to the invention.

3.4.1. Data Scramble/Descramble

The design of a terrestrial multimedia/television broadcasting system is based on an assumption that input TS streams have no correlation with each other. Hence, it is important for input data to be non-correlated. After data have been compressed, consecutive identical bits may occur. Therefore, compressed data must be scrambled to enable it to be non-correlated before it is input in the transmission layer. This allows for timing recovery and reduces OFDM signal peak-to-average power ratio.

3.4.2. RS CODEC and Outer Interleaving

Reed-Solomon (RS) code can robustly withstand burst errors, has high code efficiency; and is chosen as an outer FEC code. The system uses RS(208,188) and RS(200,200) to adapt different applications. For RS(208,188), information data are divided into bytes for future processing in RS encoder. By adding 20 bytes parity and one byte sync word per code word, RS(208,188) can correct up to 10 bytes errors and provide error detection where the number of errors present exceeds the RS code error correction capability.

A time convolutional interleaving follows the RS encoder, which is done between RS code words and has three modes according to interleaving depth and width: (104,6), (52,4) and (16,13), to handle different applications. Time interleaving disperses continuous burst errors into different RS code words so that error number in a code word does not exceed RS error correction capability.

3.4.3. Convolutional Code CODEC and Inner Interleaving

To adapt to various needs and data type in practical applications, various combinations of TCM, convolutional code and Turbo code are made, and 16QAM, 32QAM or 64QAM is chosen as an FEC inner code. A decoder uses soft decision decoding (e.g., a Viterbi algorithm).

An optional frequency domain interleaving follows the inner FEC coding, which is performed between OFDM carriers. One purpose of frequency domain interleaving is to disperse deep fading OFDM carriers into other carriers to withstand the multipath distortion so that burst errors do not appear in the Viterbi decoding. When BER is higher, burst errors may occur with Viterbi decoding. Presently, time domain interleaving will disperse burst errors into different RS code words.

3.4.4. TDS-OFDM Modulation/Demodulation

The system uses a TDS-OFDM scheme discussed in the preceding; a pseudorandom sequence is spread by Walsh code and is used for the Frame Sync Header. The system can implement fast synchronization, where sync capture time is about 5 msec. By contrast, other DTV standard sync capture times are often more than 100 msec. The system is also able to recover sync at SNR levels below −20 dB.

At the same time, the time domain PN sequence can be used for channel estimation, utilizing a channel impulse response algorithm with the following features: higher stability against noise, lower algorithm complexity, and higher precision.

An OFDM demodulation procedure includes sync setup, frequency determination, offset correction, channel estimation and decoding in the following procedure: (1) Utilizing match filter or other correlative algorithm to detect frame sync information and setup frame sync; (2) Frequency offset must be correct because OFDM is sensitive to it; (3) Computing multipath channel impulse response to obtain an equalization factor; (4) Inverse transform of a DFT data block; (5) Removal of multipath distortion; and (6) FEC decoding.

4. Description of Computer Simulation of the Invention

The procedure discussed in the preceding has been simulated by computer, with the following results, based on computer simulation, the prototype utilizes FPGA.

4.1. Channel Performance Simulation

Figure 28:
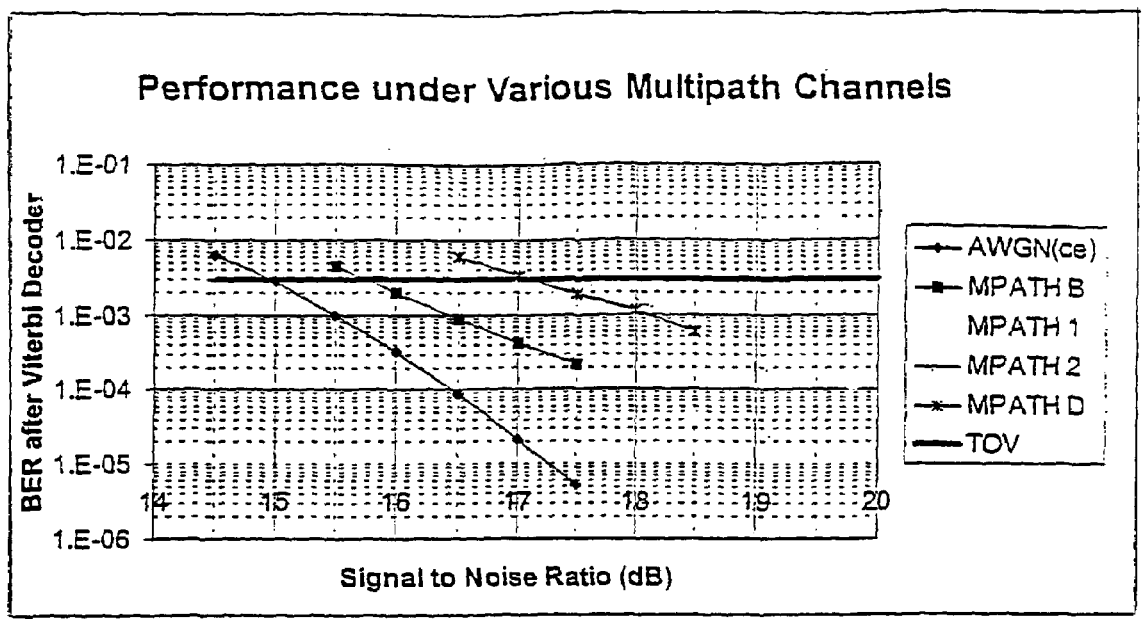
FIG. 28 graphically shows the transmission performance for channel models.
Figure 29:
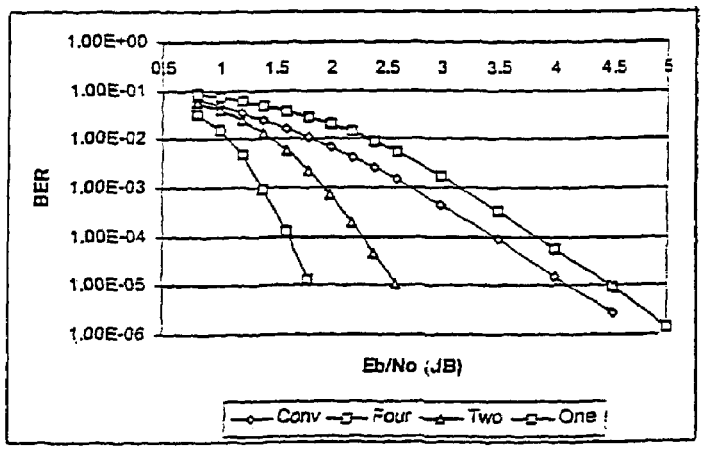
FIG. 29 graphically shows a QPSK performance curve.
Figure 30:
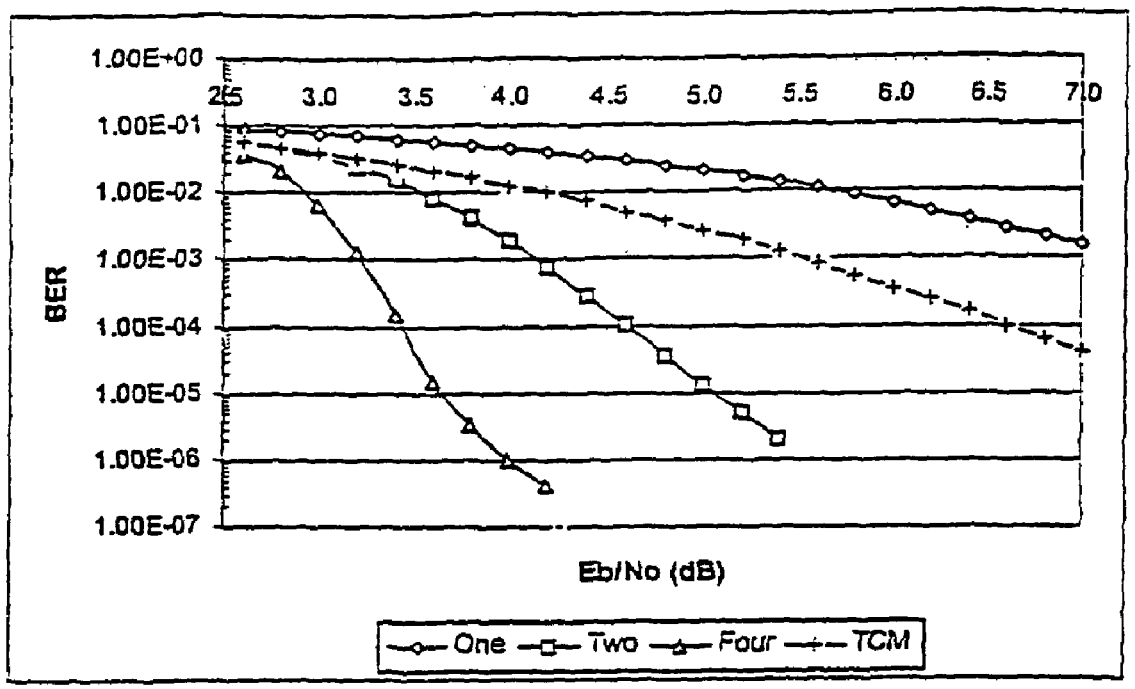
FIG. 30 graphically shows a 16QAM performance curve.
Figure 31:
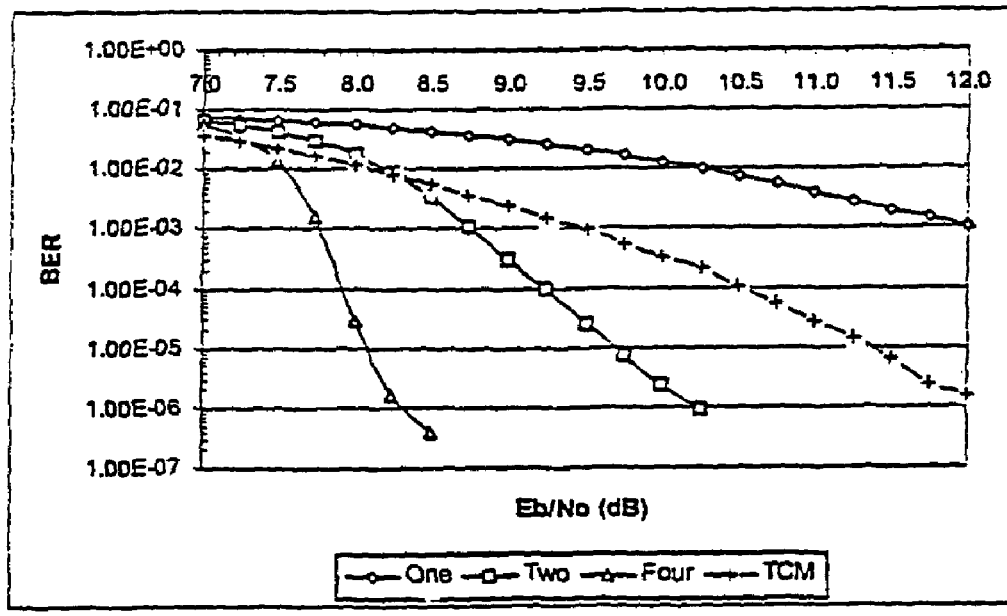
FIG. 31 graphically shows a 64QAM performance curve.

Transmission system simulation model assumes that additive white Gauss Noise (AWGN) is present, as well as static multipath echo dynamic multipath echo, 0 dB echo interference, fading channel, impulse noise and single frequency interference. Some simulation results are shown in FIG. 28.

4.2. QPSK

Table 11 presents the results for a QPSK format. The corresponding performance curve is presented in FIG. 29. The column labeled "Conv" presents convolutional simulation results. The constraint length of the convolutional code is 9, and soft-decision Viterbi decoding is used. Columns labeled "One", "Two" and "Four" present simulation results of Turbo code with one, two and four iterations, respectively. Blank entries correspond to values less than 1.00E-7.

The rate of TC is ½. The number of states of the encoder is 8. The code generation polynomial is $$P(D)=\{1+D^2+D^3\}/\{1+D+D^3\}.$$

The block size of TC is 1248 bits. A Galois Field (GF) interleaver is used. The encoder does not generate any tail bits. In order to reduce the memory requirements at MAP decoding, a sliding window scheme is used. Each block of 1248 bits is split into 6 sub-blocks with 9 bits overlap; that is, the window size is 217 bits.

TABLE 11

| | QPSK Format | | | |
|---|---|---|---|---|
| $E_b/N_0$ | Conv | One | Two | Four |
| 0.8 | 6.60E−2 | 8.53E−2 | 5.77E−2 | 3.26E−2 |
| 1.0 | 4.89E−2 | 7.30E−2 | 4.13E−2 | 1.55E−2 |
| 1.2 | 3.54E−2 | 6.08E−2 | 2.56E−2 | 4.91E−3 |
| 1.4 | 2.46E−2 | 4.93E−2 | 1.35E−2 | 9.34E−4 |
| 1.6 | 1.67E−2 | 3.87E−2 | 5.95E−3 | 1.28E−4 |
| 1.8 | 1.07E−2 | 2.90E−2 | 2.33E−3 | 1.33E−5 |
| 2.0 | 6.65E−32 | 2.08E−3 | 7.14E−4 | |
| 2.2 | 4.31E−3 | 1.42E−2 | 1.88E−4 | |
| 2.4 | 2.57E−3 | 9.06E−3 | 4.49E−5 | |
| 2.6 | 1.55E−3 | 5.49E−3 | 1.07E−5 | |
| 3.0 | 4.42E−4 | 1.77E−3 | | |
| 3.5 | 9.07E−5 | 3.42E−4 | | |

TABLE 11-continued

| | QPSK Format | | | |
|---|---|---|---|---|
| $E_b/N_0$ | Conv | One | Two | Four |
| 4.0 | 1.53E−5 | 5.77E−5 | | |
| 4.5 | 2.79E−6 | 9.66E−6 | | |
| 5.0 | | 1.45E−6 | | |

4.3. 16QAM

Table 12 presents the results for 16QAM format. The corresponding performance curve is presented in FIG. 30. The column "TC" refers to TCM simulation results. The columns labeled "One", "Two" and "Four" give the simulation results of parallel concatenated TCM (PCTCM) with one, two and four iterations, respectively. Blank entries correspond to values less than 1.00E-7.

The PCTCM has 8 states and has a code generator h0=013, h1=004, h2=015. A natural mapping is used. The block size of PCTCM is 1248 symbols, and each symbol has 2 bits. Two S-random interleavers are used, each for one bit in a symbol. The encoder does not generate any tail bits. In order to reduce the memory requirements at MAP decoding, a sliding window scheme is used. Each block of 1248 symbols is split into 6 sub-blocks with 9 symbols overlap; the window size is 217 symbols.

TABLE 12

| | 16 QAM | | | |
|---|---|---|---|---|
| $E_b/N_0$ | One | Two | Four | TCM |
| 2.6 | 8.52E−2 | 5.73E−2 | 3.73E−2 | 5.51E−2 |
| 2.8 | 7.98E−2 | 4.55E−2 | 2.09E−2 | 4.68E−2 |
| 3.0 | 7.41E−2 | 3.44E−2 | 6.43E−3 | 3.95E−2 |
| 3.2 | 6.84E−2 | 2.43E−2 | 1.29E−3 | #.25E−2 |
| 3.4 | 6.25E−2 | 1.52E−2 | 1.45E−4 | 2.66E−2 |
| 3.6 | 5.67E−2 | 8.52E−3 | 1.50E−5 | 2.14E−2 |
| 3.8 | 5.08E−2 | 4.21E−3 | 3.23E−6 | 1.69E−2 |
| 4.0 | 4.48E−2 | 1.90E−3 | 9.96E−7 | 1.23E−2 |
| 4.2 | 3.94E−2 | 7.68E−4 | 4.29E−7 | 1.03E−2 |
| 4.4 | 3.42E−2 | 2.89E−4 | | 7.47E−3 |
| 4.6 | 2.91E−2 | 1.02E−4 | | 5.07E−3 |
| 4.8 | 2.47E−2 | 3.60E−5 | | 3.66E−3 |
| 5.0 | 2.06E−2 | 1.27E−5 | | 2.58E−3 |
| 5.2 | 1.69E−2 | 4.99E−6 | | 1.96E−3 |
| 5.4 | 1.36E−2 | 1.93E−6 | | 1.26E−3 |
| 5.6 | 1.09E−2 | | | 8.26E−4 |
| 5.8 | 8.61E−3 | | | 5.49E−4 |
| 6.0 | 6.62E−3 | | | 3.64E−4 |
| 6.2 | 5.06E−3 | | | 2.42E−4 |
| 6.4 | 3.82E−3 | | | 1.56E−4 |
| 6.6 | 2.88E−3 | | | 9.57E−5 |
| 6.8 | 2.11E−3 | | | 6.47E−5 |
| 7.0 | 1.57E−3 | | | 4.01E−5 |

4.4. 64QAM

Table 13 presents the results for 64 QAM. The corresponding performance curve is presented in FIG. 31. The column labeled "TCM" presents TCM simulation results. The columns labeled "One", "Two" and "Four" present the simulation results of parallel concatenated TCM (PCTCM) with one, two and four iterations, respectively. Blank entries correspond to values less than 1.00E-7.

The PCTCM has eight states and a code generator of h0=013, h1=004, h2=006, h3=011 and h4=007. A natural mapping is used. The block size is 1248 symbols. Each symbol has four bits, with four S-random interleavers, each for one bit in a symbol. The encoder does not generate any tail bits. In order to reduce the memory requirements at MAP decoding, a sliding window is used. Each block of 1248 bits is split into 6 sub-blocks with 9 symbols overlap; the window size is 217 symbols.

TABLE 13

| | 64 QAM | | | |
|---|---|---|---|---|
| Eb/N0 | One | Two | Four | TCM |
| 7.0 | 7.84E−2 | 6.51E−2 | 5.73E−2 | 3.76E−2 |
| 7.25 | 7.30E−2 | 5.50E−2 | 3.53E−2 | 2.94E−2 |
| 7.50 | 6.73E−2 | 4.31E−2 | 1.40E−2 | 2.26E−2 |
| 7.75 | 6.12E−2 | 3.02E−2 | 1.64E−3 | 1.68E−2 |
| 8.00 | 5.54E−2 | 1.81E−2 | 2.86E−5 | 1.21E−2 |
| 8.25 | 4.92E−2 | 9.01E−3 | 1.69E−6 | 8.50E−3 |
| 8.50 | 4.33E−1 | 3.43E−3 | 3.85E−7 | 5.75E−3 |
| 8.75 | 3.71E−2 | 1.09E−3 | | 3.86E−3 |
| 9.00 | 3.10E−2 | 3.07E−4 | | 2.43E−3 |
| 9.25 | 2.55E−2 | 9.45E−5 | | 1.51E−3 |
| 9.50 | 2.07E−2 | 2.56E−5 | | 9.33E−4 |
| 9.75 | 1.64E−2 | 7.29E−6 | | 5.60E−4 |
| 10.00 | 1.29E−2 | 2.41E−6 | | 3.27E−4 |
| 10.25 | 9.96E−3 | 9.11E−7 | | 2.14E−4 |
| 10.50 | 7.51E−4 | | | 1.04E−4 |
| 10.75 | 5.63E−3 | | | 5.45E−5 |
| 11.00 | 4.04E−3 | | | 2.72E−5 |
| 11.25 | 2.88E−3 | | | 1.40E−5 |
| 11.50 | 2.03E−3 | | | 6.22E−6 |
| 11.75 | 1.48E−3 | | | 2.37E−6 |
| 12.00 | 1.06E−3 | | | 1.47E−6 |
| 12.25 | 7.51E−4 | | | |
| 12.50 | 5.16E−4 | | | |
| 12.75 | 4.00E−4 | | | |

What is claimed is:

1. A method for transmission of information in digital form, the method comprising:

transmitting at least first and second frames, each frame having a selected number F of binary digits or bits, and each frame including a signal synchronization segment of a first selected length and a signal body segment having a second selected length, where the synchronization segment for the first frame has a selected bit pattern that distinguishes this segment from a selected bit pattern for the synchronization segment of the second frame, and where the synchronization segment for at least one of the first frame and the second frame can be used to temporally synchronize at least one of the first and second frames;

using said synchronization segment selected bit patterns to distinguish at least $2^N-1$ frames from each other, where said synchronization segment of each of said first and second frames has a length of at least N bits and N is a selected positive integer; and choosing at least one of said synchronization segment selected bit patterns to include at least one of (i) a pseudonoise sequence that is generated by an Nth degree polynomial p(x)=0, where x is a Boolean variable and (ii) a pattern generated by forming an Exclusive OR of a first sequence of binary-valued numbers that is a pseudonoise sequence that is generated by an Nth degree polynomial p(x)=0, where x is a Boolean variable, and a second sequence of binary-valued numbers that is a selected orthogonal sequence having a selected code length.

2. The method of claim 1, further comprising including in said selected bit pattern for said signal synchronization segment at least one of (i) an indicium that identifies an intended signal recipient for at least one of said first and second frames and (ii) an indicium that identifies a source of at least one of said first and second frames.

3. The method of claim 1, further comprising choosing said selected orthogonal sequence from the group of orthogonal sequences consisting of a Walsh code sequence, a Haar code sequence and a Rademacher code sequence.

4. The method of claim 1, further comprising including in said signal synchronization segments for at least one of said first and second frames a sub-segment of selected bit length F' (where F' is less than or equal to F) that is configured so that said first frame sub-segment is substantially orthogonal to said second frame sub-segment.

5. The method of claim 1, further comprising choosing said body segment of at least one of said first and second frames to have a length drawn from the class of body segment lengths consisting of the positive integers 208, 104 and 52.

6. The method of claim 5, further comprising providing error detection and correction for said digital information by using Reed Solomon encoding, designated RS(m,n), where (m,n) are a pair of integers drawn from the group of pairs consisting of (m,n) =(208,188), (208,200), (104,84), (104, 96), (52,32) and (52,44).

7. The method of claim 6, further comprising providing said error detection and correction for said digital information by using error encoding drawn from the group consisting of trellis 64QAM, trellis 16QAM, trellis QPSK, turbo trellis 64QAM, turbo trellis 16QAM, and turbo QPSK.

8. The method of claim 1, further comprising transmitting said information as at least one of (i) a high definition television signal, (ii) a cellular telephone signal having at least one intended signal recipient and (iii) a paging signal having at least one intended signal recipient.

9. The method of claim 1, further comprising transmitting said first and second frames from a network control center, having an associated data broadcasting database and being connected to the Internet, as at least one of (i) a downlinik signal to at least one base station that is spaced apart from the network control center and (ii) a downlink signal from a base station that is spaced apart from the network control center to a signal-receiving terminal that is spaced apart from at least one of the network control center and the base station.

10. The method of claim 9, further comprising transmitting said first and second frames from said base station to said network control center as an uplink signal.

11. The method of claim 9, further comprising transmitting said first and second frames from said terminal to said base station as an uplink signal.

12. The method of claim 1, further comprising choosing said signal synchronization segment length to be 721 symbols.

13. The method of claim 1, further comprising choosing said signal body segment to satisfy at least one of (i) said signal body segment length has substantially 4656 symbols and (ii) said signal body segment includes a Guard Interval sequence having substantially 912 consecutive symbols.

14. The method of claim 1, further comprising collecting a selected number F1 of said first and second frames into a Frame Group, where F1 is a selected integer at least equal to 2, and providing a selected Frame Group Header for the Frame Group.

15. The method of claim 14, further comprising performing at least one of the following: (i) choosing said number F1 to be 511 and (ii) including in said Frame Group Header a Guard Interval having substantially 936 consecutive symbols.

16. The method of claim 14, further comprising collecting a selected number F2 of said Frame Groups into a Super Frame, where F2 is a selected integer at least equal to 2, and providing a selected Super Frame Header for the Super Frame.

17. The method of claim 16, further comprising at least one of the following: (i) choosing said number F2 to be 511 and (ii) collecting a selected number F3 of said Super Frames into a Super Frame Group, where F3 is a selected integer at least equal to 2, and providing a selected Super Frame Group Header for the Super Frame Group.

18. The method of claim 17, further comprising performing at least one of the following: (i) choosing said number F3 to be about 479 and (ii) transmitting said Super Frame Group at least twice in a selected time interval having a selected time interval length of a natural day.

19. A system for transmission of information in digital form, the system comprising:
a network control center having at least one transmitter for transmitting at least first and second frames, each frame having a selected number F of binary digits or bits, and each frame including a signal synchronization segment of a first selected length and a signal body segment having a second selected length, where the synchronization segment for the first frame has a selected bit pattern that distinguishes this segment from a selected bit pattern for the synchronization segment of the second frame, and where the synchronization segment for at least one of the first frame and the second frame can be used to temporally synchronize at least one of the first and second frames, wherein said transmitter has a capacity to use said synchronization segment selected bit patterns to distinguish at least $2^N-1$ frames from each other, where said synchronization segment of each of said first and second frames has a length of at least N bits and N is a selected positive integer,
wherein at least one of said synchronization segment selected bit patterns includes at least one of (i) a pseudonoise sequence that is generated by an Nth degree polynomial p(x)=0, where x is a Boolean variable and (ii) a pattern generated by forming an Exclusive OR of a first sequence of binary-valued numbers that is a pseudonoise sequence that is generated by an Nth degree polynomial p(x)=0, where x is a Boolean variable, and a second sequence of binary-valued numbers that is a selected orthogonal sequence having a selected code length.

20. The system of claim 19, wherein said selected bit pattern for said signal synchronization segment includes at least one of (i) an indicium that identifies an intended signal recipient for at least one of said first and second frames and (ii) an indicium that identifies a source of at least one of said first and second frames.

21. The system of claim 19, wherein said orthogonal sequence is selected from the group of orthogonal sequences consisting of a Walsh code sequence, a Haar code sequence and a Rademacher code sequence.

22. The system of claim 19, wherein said signal synchronization segments for at least one of said first and second frames includes a sub-segment of selected bit length F' (where F' is less than or equal to F) that is configured so that said first frame sub-segment is substantially orthogonal to said second frame sub-segment.

23. The system of claim 19, wherein said body segment of at least one of said first and second frames has a length drawn from the class of body segment lengths consisting of the positive integers 208, 104 and 52.

24. The system of claim 23, wherein error detection and correction for said digital information is provided using Reed Solomon encoding, designated RS(m,n), where (m,n) are a pair of integers drawn from the group of pairs consisting of (m,n)=(208,188), (208,200), (104,84), (104,96), (52,32) and (52,44).

25. The system of claim 24, wherein said error detection and correction for said digital information is provided using error encoding drawn from the group consisting of trellis 64QAM, trellis 16QAM, trellis QPSK, turbo trellis 64QAM, turbo trellis 16QAM, and turbo QPSK.

26. The system of claim 19, wherein said information is transmitted as at least one of (i) a high definition television signal, (ii) a cellular telephone signal having at least one intended signal recipient and (iii) a paging signal having at least one intended signal recipient.

27. The system of claim 19, wherein at least one of said first and second frames is transmitted as at least one of (i) a downlink signal to at least one base station that is spaced apart from said network control center and (ii) a downlink signal from a base station that is spaced apart from the network control center to a signal-receiving terminal that is spaced apart from at least one of the network control center and the base station.

28. The system of claim 27, wherein at least one of said first and second frames is transmitted from said base station to said network control center as an uplink signal.

29. The system of claim 27, wherein at least one of said first and second frames is transmitted from said base station to a signal-receiving terminal that is spaced apart from at least one of said network control center and said base station, as a downlink signal.

30. The system of claim 27, wherein at least one of said first and second frames is transmitted from said terminal to said base station as an uplink signal.

31. The system of claim 19, wherein said signal synchronization segment length is 721 symbols.

32. The system of claim 19, wherein said signal body segment satisfies at least one of the following: (i) said signal body segment length is 4656 symbols and (ii) said signal body segment includes a Guard Interval sequence having substantially 912 consecutive symbols.

33. The system of claim 19, wherein a selected number F1 of said first and second frames are collected into a Frame Group, where F1 is a selected integer at least equal to 2, and providing a selected Frame Group Header for the Frame Group.

34. The system of claim 33, wherein at least one of the following is resent: (i) said number F1 is 511 and (ii) said Frame Group Header includes a Guard Interval having substantially 936 consecutive symbols.

35. The system of claim 33, wherein a selected number F2 of said Frame Groups is collected into a Super Frame, where F2 is a selected integer at least equal to 2, and providing a selected Super Frame Header for the Super Frame.

36. The system of claim 35, wherein at least one of the following is present: (i) said number F2 is 511 and (ii) a selected number F3 of said Super Frames is collected into a Super Frame Group, where F3 is a selected integer at least equal to 2, and providing a selected Super Frame Group Header for the Super Frame Group.

37. The system of claim 36, wherein at least one of the following is present: (i) said number F3 is about 479 and (ii) said Super Frame Group is transmitted at least twice in a selected time interval having a selected time interval length of a natural day.

* * * * *

UNITED STATES PATENT AND TRADEMARK OFFICE
CERTIFICATE OF CORRECTION

PATENT NO. : 7,406,104 B2  Page 1 of 1
APPLICATION NO. : 10/312486
DATED : July 29, 2008
INVENTOR(S) : Lin Yang and Zhi-Xing Yang It is certified that error appears in the above-identified patent and that said Letters Patent is hereby corrected as shown below:

Column 27, line 37, claim 9: Cancel "downlinik" and substitute --downlink--.

Column 30, line 15, claim 34: Cancel "resent:" and substitute --present:--.

Signed and Sealed this

Thirtieth Day of September, 2008

JON W. DUDAS
*Director of the United States Patent and Trademark Office*